US008238109B2

(12) United States Patent
Sagisaka

(10) Patent No.: US 8,238,109 B2
(45) Date of Patent: *Aug. 7, 2012

(54) FLEX-RIGID WIRING BOARD AND ELECTRONIC DEVICE

(75) Inventor: Katsumi Sagisaka, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 236 days.

This patent is subject to a terminal disclaimer.

(21) Appl. No.: 12/489,999

(22) Filed: Jun. 23, 2009

(65) Prior Publication Data

US 2010/0014265 A1     Jan. 21, 2010

Related U.S. Application Data

(60) Provisional application No. 61/081,176, filed on Jul. 16, 2008.

(51) Int. Cl.
*H05K 1/00* (2006.01)

(52) U.S. Cl. ........ 361/749; 361/748; 361/760; 361/803; 174/254; 174/255; 174/258; 174/259; 174/260; 174/261; 174/262; 174/264; 29/830; 439/67; 439/77

(58) Field of Classification Search .................. 361/749, 361/748, 760, 803; 174/254, 255, 258–264; 29/830; 439/67, 77
See application file for complete search history.

(56) References Cited

U.S. PATENT DOCUMENTS

| 5,219,292 | A | * | 6/1993 | Dickirson et al. | 439/67 |
|---|---|---|---|---|---|
| 5,428,190 | A | * | 6/1995 | Stopperan | 174/261 |
| 5,999,415 | A | * | 12/1999 | Hamzehdoost | 361/803 |
| 6,015,301 | A | * | 1/2000 | Brodsky et al. | 439/73 |
| 6,353,189 | B1 | * | 3/2002 | Shimada et al. | 174/255 |
| 6,605,357 | B1 | * | 8/2003 | Miyake et al. | 428/420 |
| 6,774,968 | B2 | * | 8/2004 | Hagiwara | 349/139 |
| 6,888,606 | B2 | * | 5/2005 | Hinata et al. | 349/149 |
| 7,088,417 | B2 | * | 8/2006 | Kamijima et al. | 349/152 |
| 7,378,596 | B2 | * | 5/2008 | Kawaguchi et al. | 174/255 |

(Continued)

FOREIGN PATENT DOCUMENTS

JP     2004-186375     7/2004

(Continued)

OTHER PUBLICATIONS

U.S. Appl. No. 12/494,553, filed Jun. 30, 2009, Sagisaka.

*Primary Examiner* — Xiaoliang Chen
(74) *Attorney, Agent, or Firm* — Oblon, Spivak, McClelland, Maier & Neustadt, L.L.P.

(57) ABSTRACT

A flex-rigid wiring board including a flexible printed wiring board, a rigid printed wiring board, a first connection terminal formed over the rigid printed wiring board and positioned to be mounted onto a motherboard, and a second connection terminal formed over the rigid printed wiring board and positioned to mount an electronic component. The flexible printed wiring board has a first conductive layer, the rigid printed wiring board has a rigid base material, an insulation layer over the rigid base material and a second conductive layer formed over the insulation layer. The insulation layer covers at least a portion of the flexible printed wiring board and at least a portion of the rigid base material while exposing at least a portion of the flexible printed wiring board, and the first conductive layer and the second conductive layer are connected through a plated metallic layer penetrating through the insulation layer.

23 Claims, 23 Drawing Sheets

U.S. PATENT DOCUMENTS

| | | | |
|---|---|---|---|
| 7,423,219 B2 * | 9/2008 | Kawaguchi et al. | 174/254 |
| 7,655,869 B2 * | 2/2010 | Kawaguchi et al. | 174/254 |
| 7,729,570 B2 * | 6/2010 | Yamada et al. | 385/14 |
| 7,982,135 B2 * | 7/2011 | Takahashi et al. | 174/254 |
| 2003/0222260 A1 * | 12/2003 | Tone et al. | 257/48 |
| 2004/0112632 A1 * | 6/2004 | Michiwaki et al. | 174/254 |
| 2004/0174487 A1 * | 9/2004 | Yamazaki et al. | 349/150 |
| 2005/0243528 A1 * | 11/2005 | Murayama | 361/760 |
| 2006/0133819 A1 * | 6/2006 | Yu et al. | 398/164 |
| 2006/0169485 A1 * | 8/2006 | Kawaguchi et al. | 174/254 |
| 2006/0180344 A1 * | 8/2006 | Ito et al. | 174/262 |
| 2007/0012475 A1 * | 1/2007 | Kawaguchi et al. | 174/255 |
| 2007/0013041 A1 * | 1/2007 | Ishigaki et al. | 257/686 |
| 2007/0081309 A1 * | 4/2007 | Urushibara et al. | 361/748 |
| 2008/0014768 A1 * | 1/2008 | Lee et al. | 439/77 |
| 2008/0047737 A1 * | 2/2008 | Sahara et al. | 174/254 |
| 2008/0093118 A1 * | 4/2008 | Takahashi et al. | 174/264 |
| 2008/0099230 A1 * | 5/2008 | Takahashi et al. | 174/250 |
| 2008/0105456 A1 * | 5/2008 | Kawaguchi et al. | 174/255 |
| 2008/0107802 A1 * | 5/2008 | Kawaguchi et al. | 427/97.2 |
| 2008/0139011 A1 * | 6/2008 | Uka | 439/65 |
| 2008/0168651 A1 * | 7/2008 | Bhatt et al. | 29/830 |
| 2008/0283284 A1 * | 11/2008 | Koyama et al. | 174/261 |
| 2008/0289859 A1 * | 11/2008 | Mikado et al. | 174/254 |
| 2009/0084597 A1 * | 4/2009 | Chuma et al. | 174/261 |
| 2010/0025086 A1 * | 2/2010 | Stahr et al. | 174/254 |
| 2010/0065313 A1 * | 3/2010 | Takeuchi et al. | 174/258 |

FOREIGN PATENT DOCUMENTS

| | | |
|---|---|---|
| JP | 2006-237231 | 9/2006 |
| JP | 2006-310541 | 11/2006 |
| JP | 4021472 B1 | 10/2007 |
| JP | 4024846 B1 | 10/2007 |

* cited by examiner

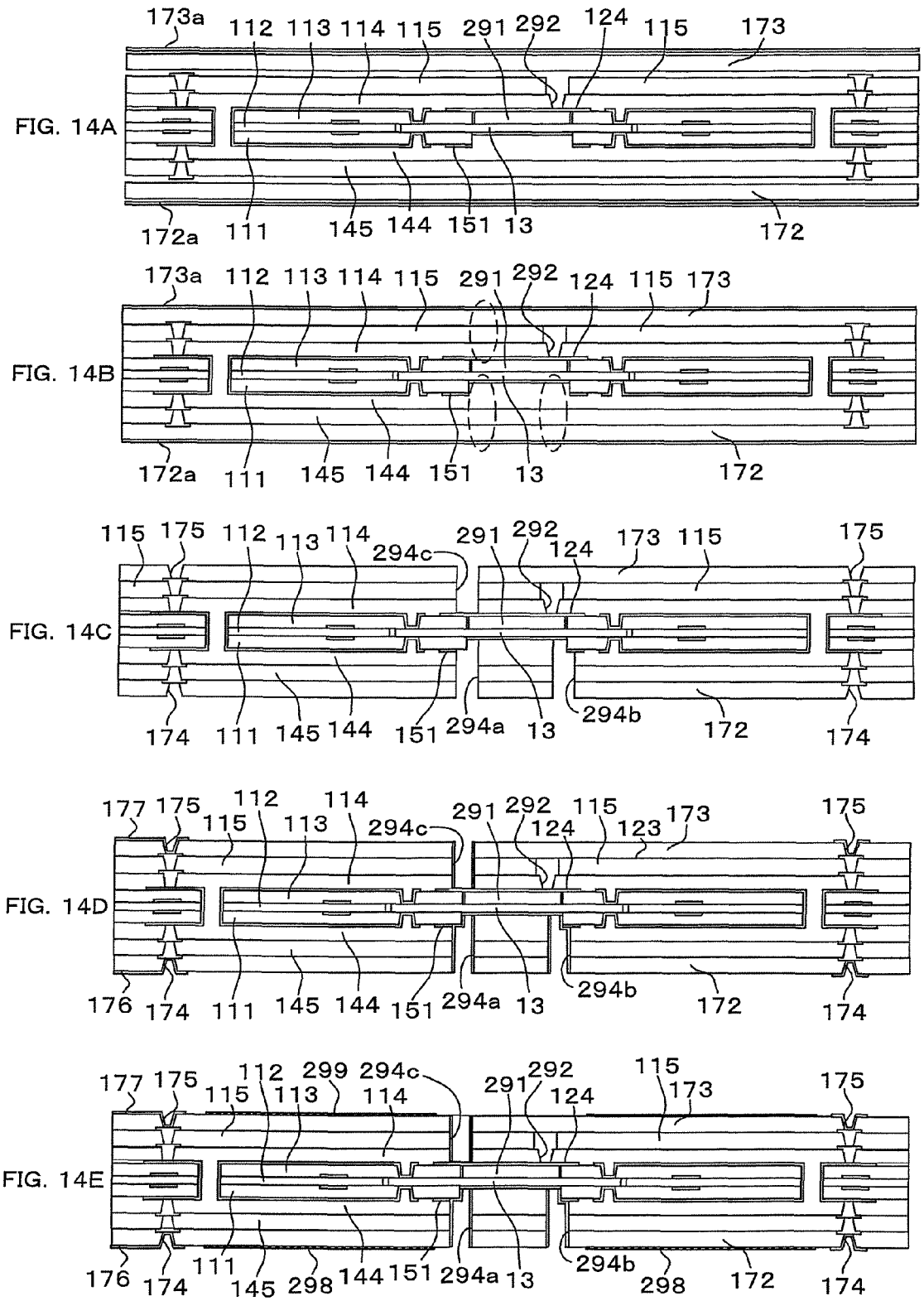

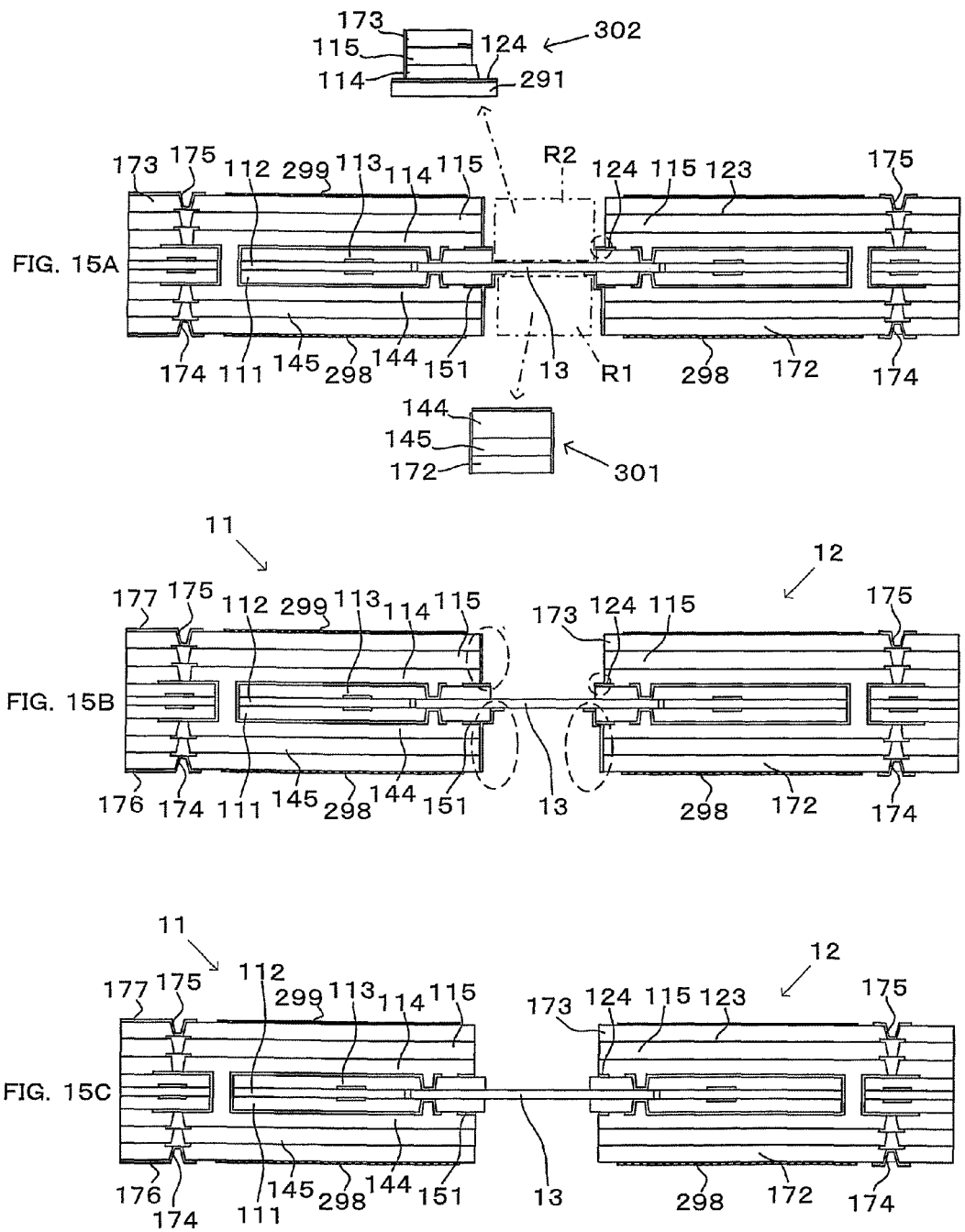

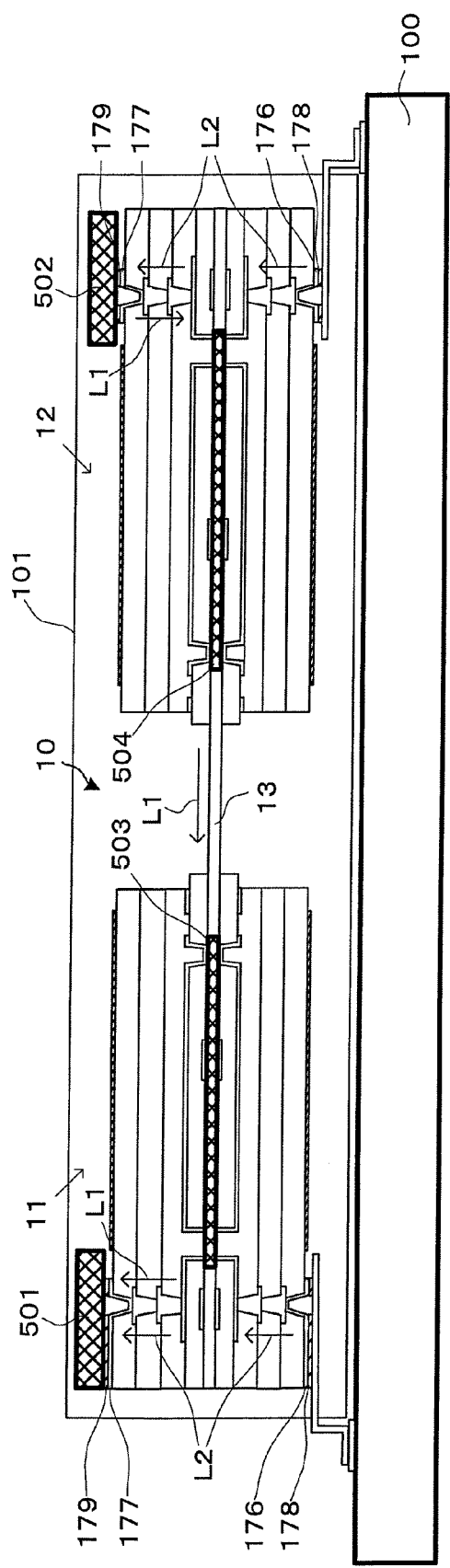

FLEX-RIGID WIRING BOARD AND ELECTRONIC DEVICE

CROSS-REFERENCE TO RELATED APPLICATIONS

The present application claims the benefits of priority to U.S. Application No. 61/081,176, filed Jul. 16, 2008. The contents of that application are incorporated herein by reference in their entirety.

BACKGROUND OF THE INVENTION

1. Field of the Invention

The present invention is related to a bendable flex-rigid wiring board, part of which is formed with a flexible substrate, and to an electronic device using the flex-rigid wiring board.

2. Discussion of the Background

Conventionally, an electronic device is known in which a rigid substrate with a mounted electronic component is sealed in packaging (PKG) of any type and is mounted on a motherboard by means of, for example, a pin connection or a soldering connection. For example, as shown in FIG. 23, in Japanese Patent Application 2002-350974 (Publication 2004-186375), as for a structure to electrically connect multiple rigid substrates 1001, 1002 which are mounted on motherboard 1000, a structure (mid-air highway structure) is disclosed where flexible substrate 1003 is connected to connectors (1004a, 1004b) arranged on the surfaces of rigid substrates 1001, 1002 respectively, and rigid substrates 1001, 1002 and electronic components (1005a, 1005b) mounted on their surfaces are electrically connected with each other through flexible substrate 1003. The contents of this publication are incorporated herein by reference in their entirety.

SUMMARY OF THE INVENTION

According to one aspect of the present invention, a flex-rigid wiring board includes a flexible printed wiring board, a rigid printed wiring board, a first connection terminal formed over the rigid printed wiring board and positioned to be mounted onto a motherboard, and a second connection terminal formed over the rigid printed wiring board and positioned to mount an electronic component. The flexible printed wiring board has a first conductive layer, the rigid printed wiring board has a rigid base material, an insulation layer over the rigid base material and a second conductive layer formed over the insulation layer. The insulation layer covers at least a portion of the flexible printed wiring board and at least a portion of the rigid base material while exposing at least a portion of the flexible printed wiring board, and the first conductive layer and the second conductive layer are connected through a plated metallic layer penetrating through the insulation layer.

According to another aspect of the present invention, an electronic device includes a motherboard and a flex-rigid wiring board mounted on a surface of the motherboard and having a flexible printed wiring board and a rigid printed wiring board. The flexible printed wiring board has a first conductive layer, the rigid printed wiring board has a rigid base material, an insulation layer over the rigid base material and a second conductive layer formed over the insulation layer, the insulation layer covers at least a portion of the flexible printed wiring board and at least a portion of the rigid base material while exposing at least a portion of the flexible printed wiring board, and the first conductive layer and the second conductive layer are connected through a plated metallic layer penetrating through the insulation layer.

According to yet another aspect of the present invention, an electronic device includes a flex-rigid wiring board having a flexible printed wiring board and a rigid printed wiring board, an electronic component mounted over a surface of the rigid printed wiring board, and a connection terminal formed over the flex-rigid wiring board and positioned to mount the flex-rigid wiring board onto a motherboard. The flexible printed wiring board has a first conductive layer, the rigid printed wiring board has a rigid base material, an insulation layer over the rigid base material and a second conductive layer formed over the insulation layer, the insulation layer covers at least a portion of the flexible printed wiring board and at least a portion of the rigid base material while exposing at least a portion of the flexible printed wiring board, and the first conductive layer and the second conductive layer are connected through a plated metallic layer penetrating through the insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 14A is a view illustrating a step to form a fourth layer;
FIG. 14B is a view illustrating a step to form a fourth layer;

FIG. 14C is a view illustrating a step to form a fourth layer;

FIG. 14D is a view illustrating a step to form a fourth layer;

FIG. 14E is a view illustrating a step to form a fourth layer;

FIG. 15A is a view illustrating a step to expose part (a center portion) of a flexible substrate;

FIG. 15B is a view showing a stage in which the center portion of the flexible substrate is exposed;

FIG. 15C is a view showing a stage after the remaining copper is removed;

FIG. 20 is a view illustrating yet another modified example of the electronic device;

DETAILED DESCRIPTION OF THE PREFERRED EMBODIMENTS

Figure 1A:
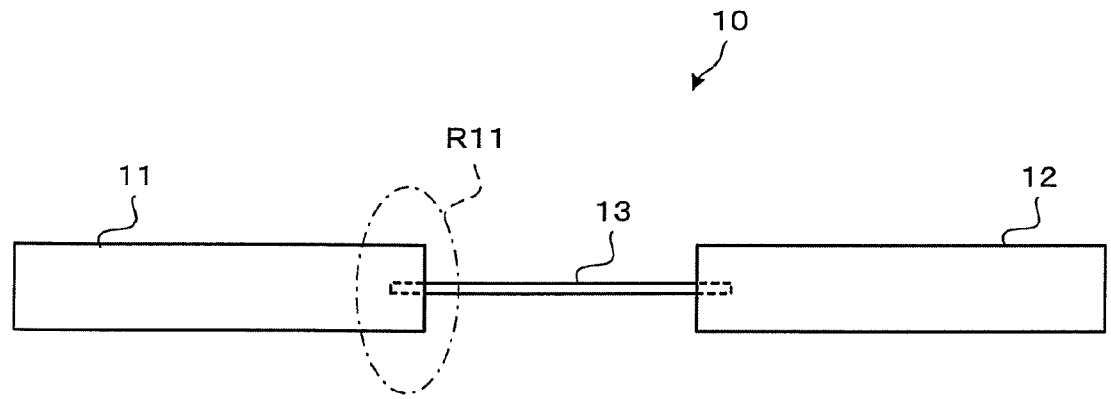
FIG. 1A is a side view of a flex-rigid wiring board according to an embodiment of the present invention.

The embodiments will now be described with reference to the accompanying drawings, wherein like reference numerals designate corresponding or identical elements throughout the various drawings.

Figure 1B:
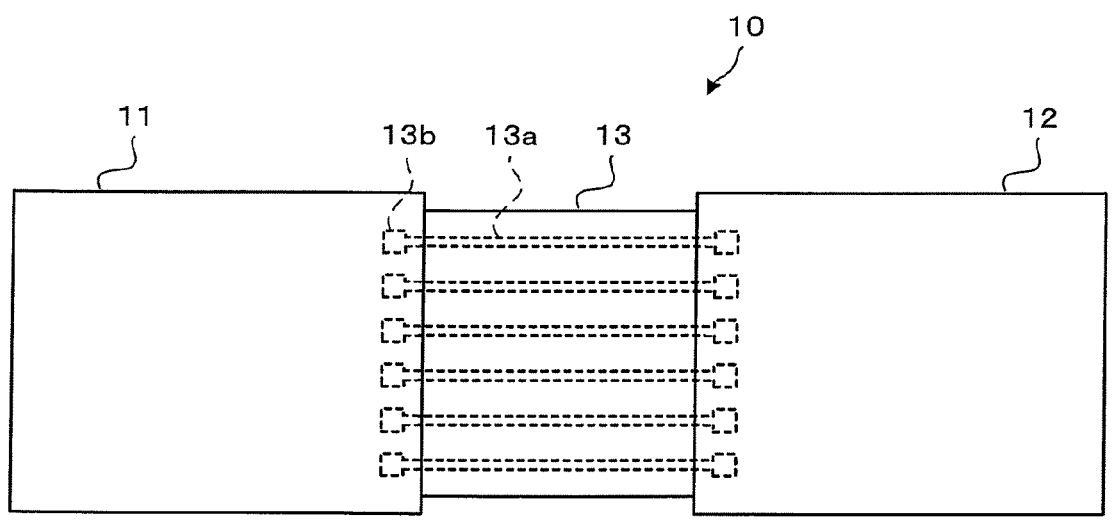
FIG. 1B is a plan view of a flex-rigid wiring board according to an embodiment of the present invention.

As shown in FIGS. 1A and 1B, flex-rigid wiring board 10 according to the present embodiment is made up of first rigid substrate 11 and second rigid substrate 12 (both are rigid printed wiring boards) and flexible substrate 13 (flexible printed wiring board); first rigid substrate 11 and second rigid substrate 12 face each other and sandwich flexible substrate 13 in between. More specifically, first and second rigid substrates 11, 12 are arranged horizontal to flexible substrate 13.

In each of first and second rigid substrates 11, 12, a circuit pattern of any type is formed, and electronic components such as semiconductor chips or the like are connected according to requirements. Meanwhile, in flexible substrate 13, striped wiring pattern (13a) is formed to connect a circuit pattern of first rigid substrate 11 and a circuit pattern of second rigid substrate 12. Wiring pattern (13a) connects circuit patterns of rigid substrates 11, 12 to each other.

Figure 2:
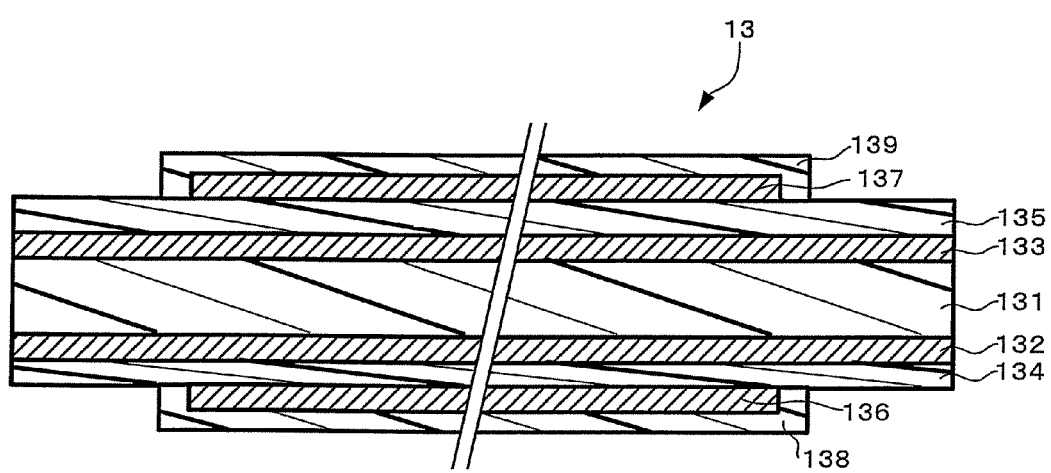
FIG. 2 is a cross-sectional view of a flexible substrate.

Flexible substrate 13 has, as its detailed structure is shown in FIG. 2, a structure made by laminating base material 131, conductive layers 132, 133, insulation films 134, 135, shield layers 136, 137 and coverlays 138, 139.

Base material 131 is formed with an insulative flexible sheet, for example, a polyimide sheet, with a thickness in the range of 20-50 μm, preferably with an approximate thickness of 30 μm.

Conductive layers 132, 133 are made of a copper pattern with an approximate thickness of 5-15 μm; they are formed on the front and back, respectively, of base material 131 to structure the above-described striped wiring pattern (13a) (FIG. 1B).

Insulation films 134, 135 are made with a polyimide film or the like with an approximate thickness of 5-15 μm, and insulate conductive layers 132, 133 from the outside.

Shield layers 136, 137 are made with a conductive layer, for example, a cured silver paste film, and shield conductive layers 132, 133 from external electromagnetic noise, and shield the electromagnetic noise from conductive layers 132, 133 from going outside.

Coverlays 138, 139 are made with an insulative film such as polyimide with an approximate thickness of 5-15 μm; they insulate and protect the entire flexible substrate 13 from the outside.

Figure 3:
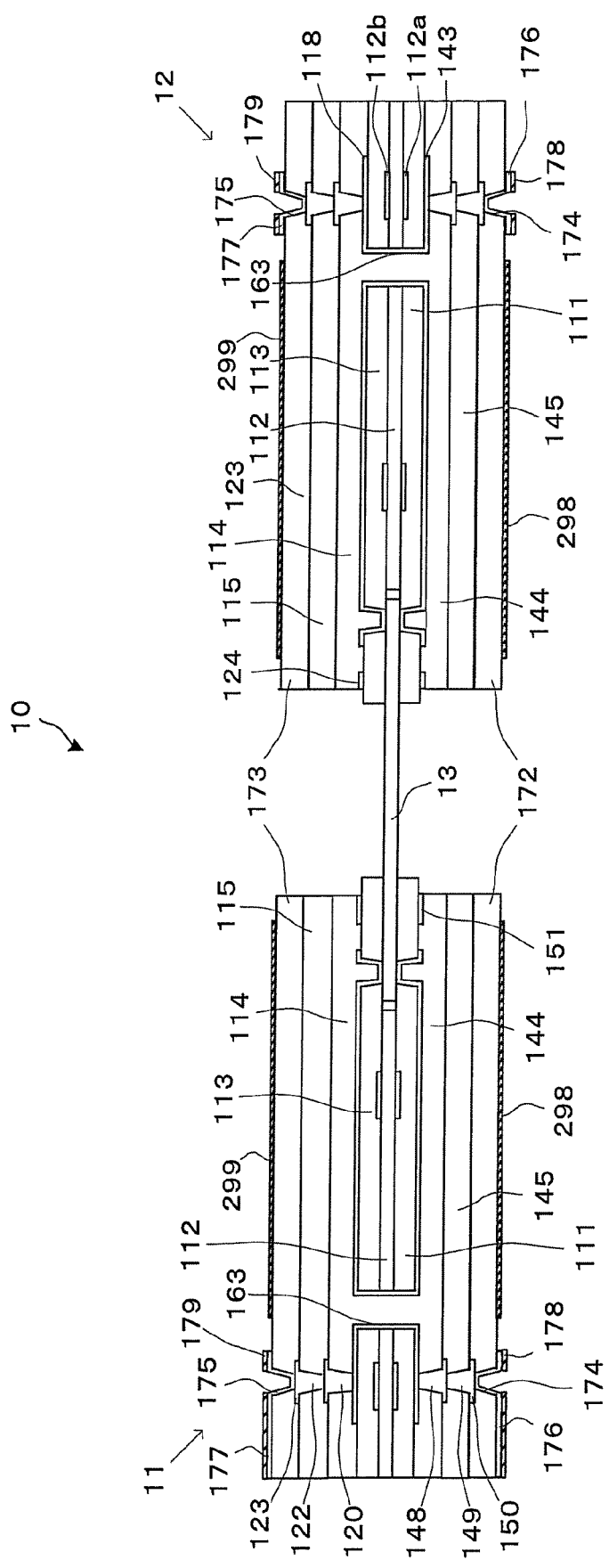
FIG. 3 is a cross-sectional view of a flex-rigid wiring board.

On the other hand, rigid substrates 11, 12, as is shown in FIG. 3, each are formed by laminating rigid base material 112, first and second insulation layers 111, 113, first and second upper-layer insulation layers 144, 114, third and fourth upper-layer insulation layers 145, 115, and fifth and sixth upper-layer insulation layers 172, 173.

Rigid base material 112 provides rigidity for rigid substrates 11, 12 and is formed with a rigid insulative material such as glass epoxy resin. Rigid base material 112 is arranged horizontal to flexible substrate 13 without touching it. Rigid base material 112 has substantially the same thickness as flexible substrate 13. Also, on the front and back of rigid base material 112, conductive patterns (112a, 112b) made of copper, for example, are formed respectively. Conductive patterns (112a, 112b) are each electrically connected to a further upper-layer conductor (wiring) at a predetermined spot.

First and second insulation layers 111, 113 are formed by curing a prepreg. First and second insulation layers 111, 113 each have a thickness in the range of 50-100 μm, preferably an approximate thickness of 50 μm. The prepreg is preferred to contain a resin with low-flow characteristics. Such a prepreg may be formed by impregnating a glass cloth with epoxy resin and by thermosetting the resin beforehand to advance its degree of curing. However, such a prepreg may also be made by impregnating a glass cloth with a highly viscous resin, or by impregnating a glass cloth with inorganic filler (such as silica filler), or by reducing the resin amount to be impregnated in a glass cloth.

Rigid base material 112 and first and second insulation layers 111, 113 form the core for rigid substrates 11, 12 and support rigid substrates 11, 12. In the core section, through-holes (penetrating holes) 163 are formed to electrically interconnect the conductive patterns on both surfaces of the substrate.

Figure 4:
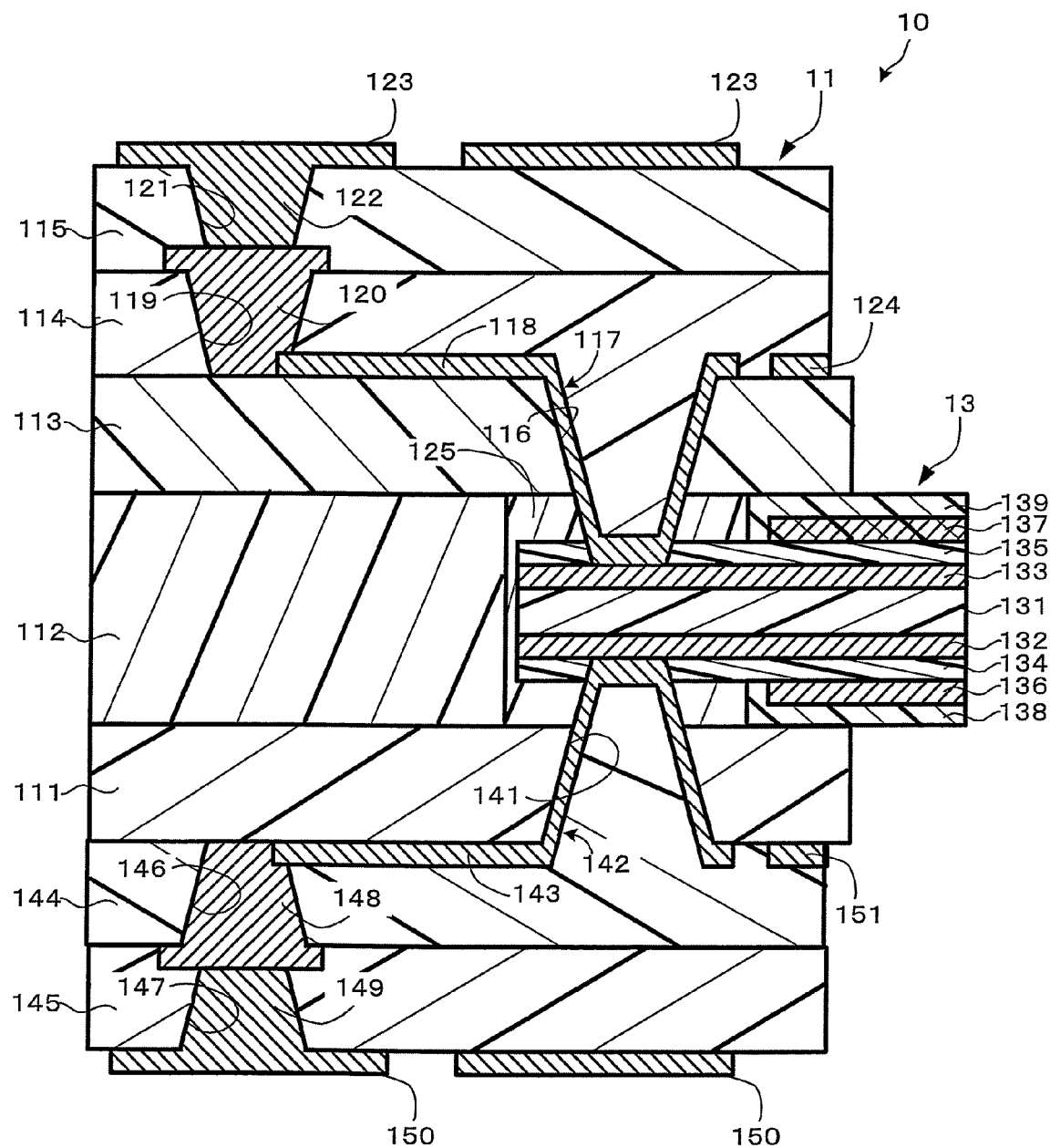
FIG. 4 is a partially enlarged view of FIG. (1A)

Rigid substrates 11, 12 and flexible substrate 13 are connected at the core sections of rigid substrates 11, 12 respectively. First and second insulation layers 111, 113 support and anchor flexible substrate 13 by sandwiching its tips. Specifically, as FIG. 4 shows an enlarged view of region (R11) (the connected section between first rigid substrate 11 and flexible substrate 13) shown in FIG. 1A, first and second insulation layers 111, 113 cover rigid base material 112 and flexible substrate 13 from the top and back sides while exposing part of flexible substrate 13. First and second insulation layers 111, 113 are polymerized with coverlays 138, 139 formed on the surfaces of flexible substrate 13.

The structure of the connection section between rigid substrate 12 and flexible substrate 13 is the same as the structure (FIG. 4) of the connection section between rigid substrate 11 and flexible substrate 13. Therefore, the detailed description of the connection section of rigid substrate 12 is omitted here.

In the spaces (gaps among such members) sectioned off by rigid base material 112, flexible substrate 13 and first and second insulation layers 111, 113, resin 125 is filled as shown in FIG. 4. Resin 125 is a kind of resin, for example, that seeps from the low-flow prepreg which forms first and second insulation layers 111, 113 during the manufacturing process and is cured to be integrated with first and second insulation layers 111, 113.

At the portions of first and second insulation layers 111, 113 facing connection pads (13b) on conductive layers 132, 133 of flexible substrate 13, vias (contact holes) 141, 116 are formed respectively. From each portion of flexible substrate 13 facing vias 141, 116 (the portion where connection pad (13b) is formed as shown in FIG. 1B), shield layers 136, 137 and coverlays 138, 139 of flexible substrate 13 are removed. Vias 141, 116 penetrate insulation layers 134, 135 of flexible substrate 13 respectively, and expose each connection pad (13b) formed from conductive layers 132, 133.

On each inner surface of vias 141, 116, wiring patterns (conductive layers) 142, 117 made of copper plating or the like are formed respectively. The plated metallic layers of wiring patterns 142, 117 are connected respectively to connection pads (13b) on conductive layers 132, 133 of flexible substrate 13. In vias 141, 116, resin is filled. The resin in vias 141, 116 is filled by being squeezed from the upper-layer insulation layers (upper-layer insulation layers 144, 114) by pressing, for example. Furthermore, on each top surface of first and second insulation layers 111, 113, extended patterns 143, 118, which are connected to wiring patterns 142, 117, are formed respectively. Extended patterns 143, 118 are formed with, for example, a copper-plated layer. Also, at the tips of first and second insulation layers 111, 113 on the side of flexible substrate 13, namely, at the areas of flexible substrate 13 that are positioned outside the boundary between flexible substrate 13 and rigid base material 112, conductive patterns 151, 124 insulated from the rest are arranged respectively. Heat generated in rigid substrate 11 is effectively radiated through conductive patterns 151, 124.

As described so far, in flex-rigid wiring board 10 according to the present embodiment, rigid substrates 11, 12 and flexible substrate 13 are electrically connected without using connectors. Namely, flexible substrate 13 is inserted in rigid substrates 11, 12 respectively, and flexible substrate 13 is electrically connected to each rigid substrate at the inserted portion (see FIG. 4). Accordingly, even when an impact from being dropped or the like is exerted, poor connection due to disconnected connectors will not occur. In this sense, flex-rigid wiring board 10 features highly reliable electrical connection, compared with a substrate where connection is achieved through connectors.

Also, since flexible substrate 13 is used for connection, connectors or jigs are not required to connect rigid substrates 11, 12. Accordingly, a reduction in manufacturing cost may be achieved.

Also, flexible substrate 13 is made up partially of a flex-rigid wiring board, and part of it is embedded in rigid substrates 11, 12 respectively. Therefore, without making a substantial change in the design of rigid substrates 11, 12, both substrates 11, 12 may be electrically connected to each other. Moreover, since the connection is carried out inside the substrates, larger mounting areas are secured on the surfaces of the substrates compared with the above-described mid-air highway structure. Accordingly, more electronic components may be mounted.

In addition, conductive layers 132, 133 of flexible substrate 13 and wiring patterns 142, 117 of rigid substrates 11, 12 are connected through taper-shaped vias. Thus, compared with a connection by means of through-holes which extend in a direction that makes a right angle to the substrate surface, stresses exerted from impact may be dispersed and thus cracks or the like may seldom occur. Moreover, since conductive layers 132, 133 and wiring patterns 142, 117 are connected through plated metallic layers, reliability at the connected areas is high. Besides, resin is filled in vias 141, 116, further increasing connection reliability.

On the top surfaces of first and second insulation layers 111, 113, first and second upper-layer insulation layers 144, 114 are laminated respectively. In first and second upper-layer insulation layers 144, 114, vias (first upper-layer vias) 146, 119 connected to extended patterns 143, 118 are formed respectively. In addition, vias 146, 119 are filled respectively with conductors 148, 120 made of copper, for example. First and second upper-layer insulation layers 144, 114 are formed by curing a prepreg made, for example, by impregnating glass cloth with resin.

On the top surfaces of first and second upper-layer insulation layers 144, 114, third and fourth upper-layer insulation layers 145, 115 are laminated respectively. Third and fourth upper-layer insulation layers 145, 115 are also formed by curing a prepreg made, for example, by impregnating glass cloth with resin. In third and fourth upper-layer insulation layers 145, 115, vias (second upper-layer vias) 147, 121 connected to vias 146, 119 are formed respectively. Vias 147, 121 are filled respectively with conductors 149, 122 made of copper, for example. Conductors 149, 122 are electrically connected to conductors 148, 120 respectively. Accordingly, filled build-up vias are formed by vias 146, 147, 119, 121.

On the top surfaces of third and fourth upper-layer insulation layers 145, 115, conductive patterns (circuit patterns) 150, 123 are formed respectively. Then, by connecting vias 147, 121 to predetermined spots of conductive patterns 150, 123 respectively, conductive layer 133 and conductive pattern 123 are electrically connected through wiring pattern 117, extended pattern 118, conductor 120 and conductor 122; and conductive layer 132 and conductive pattern 150 are electrically connected through wiring pattern 142, extended pattern 143, conductor 148 and conductor 149.

On the top surfaces of third and fourth upper-layer insulation layers 145, 115, fifth and sixth upper-layer insulation layers 172, 173 are further laminated respectively as shown in FIG. 3. Fifth and sixth upper-layer insulation layers 172, 173 are also formed by curing a prepreg made, for example, by impregnating glass cloth with resin.

In fifth and sixth upper-layer insulation layers 172, 173, vias 174, 175 connected to vias 147, 121 are formed respectively. On the top and bottom of the substrate including the inner surfaces of vias 174, 175, conductive patterns 176, 177 made of copper, for example, are formed respectively. Conductive patterns 176, 177 are electrically connected to conductors 149, 122 respectively. Moreover, on the top and bottom of the substrate, patterned solder resists 298, 299 are formed respectively. Electrodes 178, 179 (connection terminals) are formed, for example, by chemical gold plating at each predetermined spot in conductive patterns 176, 177.

Figure 5:
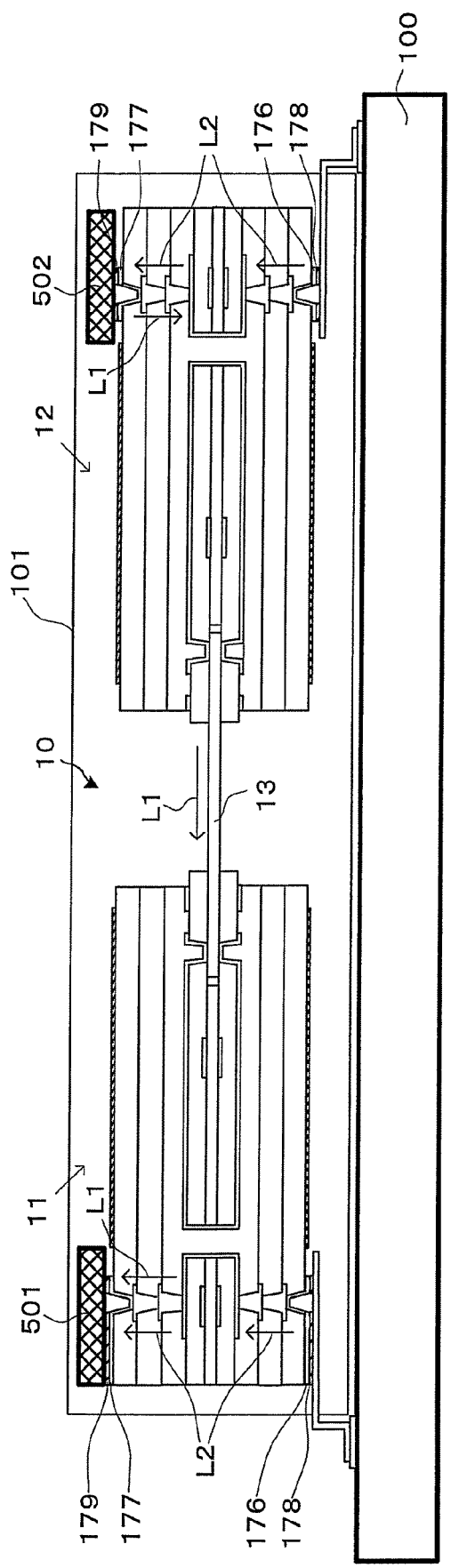
FIG. 5 is a cross-sectional view of an electronic device according to an embodiment of the present invention.

On a surface of flex-rigid wiring board 10, for example, as shown in FIG. 5, using for example, a flip-chip connection, electronic component 501 such as a CPU is mounted on rigid substrate 11 and electronic component 502 such as memory is mounted on rigid substrate 12. Then, the wiring board is sealed, for example, in rectangular packaging 101. Packaging 101 may be given any shape; it may be square, for example. Also, any material is selected for packaging 101; for example, packaging made of metal, ceramic or plastic may be used. Also, the type of packaging 101 may be selected freely; for example, any packaging such as DIP, QFP, PGA, BGA or CSP may be used. In addition, electronic components 501, 502 are not limited to active components such as an IC circuit, but may be passive components such as a resistor, capacitor or coil. Furthermore, any method for mounting electronic components 501, 502 may be employed; for example, they may be mounted by wire bonding.

Then, flex-rigid wiring board 10 is mounted by a surface-mounting method using, for example, soldering, on motherboard 100 which is a rigid substrate. Accordingly, an electronic device is formed. Since such an electronic device is reinforced by flexible substrate 13 on the side where flex-rigid wiring board 10 is mounted, even when an impact is exerted from being dropped or the like, such an impact is reduced on the side where motherboard 100 is. Thus, cracks may seldom occur in motherboard 100. Motherboard 100 is a printed wiring board of sufficient size to install multiple printed circuit boards; it has connection terminals for connection to printed circuit boards, and includes an expansion board (daughter board) or the like. As for motherboard 100, a rigid printed wiring board that has larger wiring pitches than rigid substrates 11, 12 is used here. Also, any method for mounting flex-rigid wiring board 10 may be employed; for example, it may be mounted by an insertion mounting method (pin connection).

Electronic components 501, 502 are electrically connected to each other through signal lines formed with the conductors in flex-rigid wiring board (wiring patterns 117, 142, extended patterns 118, 143, conductors 120, 122, 148, 149, conductive patterns 123, 124, 150, 151, 176, 177, conductive layers 132, 133 and so forth). Those signal lines allow mutual signal transmission. Those signal lines electrically connect electronic component 501 and electronic component 502 using routes that avoid through-holes 163. Accordingly, signals between electronic components 501, 502 are transmitted only along the upper side of the substrate (outside the boundary of the core, on the side of rigid substrates 11, 12 where the electronic components are mounted); signals are not transmitted from the upper side to the lower side (outside the boundary of the core, on the side where motherboard 100 is positioned). Namely, for example, signals from electronic component 502 (memory) are transmitted to electronic component 501 (CPU) through, for example, as arrows (L1) show in FIG. 5, conductors 122, 120, extended pattern 118, wiring pattern 117, conductive layer 133, wiring pattern 117, extended pattern 118, conductors 120, 122 in that order (see FIGS. 3-4 for detail). By making such a structure, the route for signal transmission between electronic components is made shorter without detouring to motherboard 100. By shortening the signal transmission route, the parasitic capacitance or the like is reduced. Accordingly, high-speed signal transmission between electronic components may be achieved. Also, by shortening the signal transmission route, noise contained in the signal is reduced.

By making such a structure, electrical signals between electronic component 501 and electronic component 502 may be transmitted without using connectors. Thus, the cost of electronic devices may be reduced.

On the other hand, a power source for electronic components 501, 502 is supplied from motherboard 100. Namely, the conductors in flex-rigid wiring board 10 form power-source lines to supply a power source from motherboard 100 to each of electronic components 501, 502. The power-source lines provide a power source for each of electronic components 501, 502 by the routes through conductors 149, 148, through-hole 163 and conductors 120, 122 (see FIG. 3 for detail), as arrows (L2) show in FIG. 5, for example. In so structuring, while a required power source is provided for each of electronic components 501, 502, high-speed signal transmission between electronic components 501, 502 may be achieved.

When manufacturing flex-rigid wiring board 10, flexible substrate 13 (FIG. 2) is manufactured first. Specifically, a copper film is formed on both surfaces of polyimide base material 131 prepared to be a predetermined size. In the following, by patterning the copper films, conductive layers 132, 133 are formed that have wiring patterns (13a) and connection pads (13b). Then, on each surface of conductive layers 132, 133, insulation films 134, 135 made of polyimide, for example, are formed through a laminating process. Furthermore, after silver paste is applied on insulation films 134, 135 except for the tips of flexible substrate 13, the silver paste is cured to form shield layers 136, 137. Then, coverlays 138, 139 are formed to cover each surface of shield layers 136, 137. Here, shield layers 136, 137 and coverlays 138, 139 are formed to avoid connection pads (13b).

Figure 6:
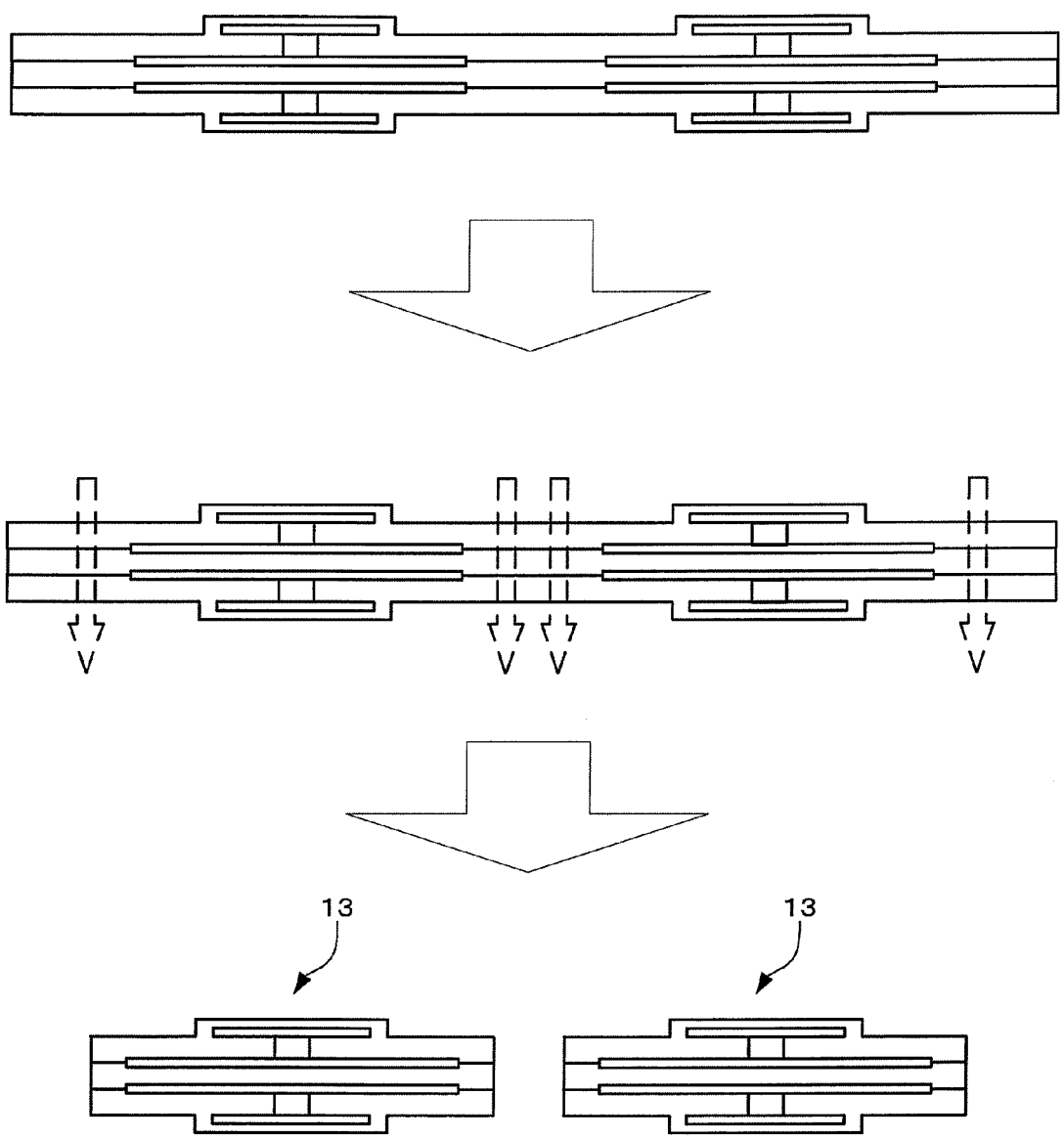
FIG. 6 are views illustrating steps to cut out flexible substrates from a wafer commonly used for multiple products.

Through such a series of steps, a wafer having a laminated structure shown in FIG. 2 is completed. Such a wafer is used as a material commonly used for multiple products. Namely, as shown in FIG. 6, by cutting the wafer into a predetermined size using a laser or the like, flexible substrate 13 of a predetermined size is obtained.

Figure 7:
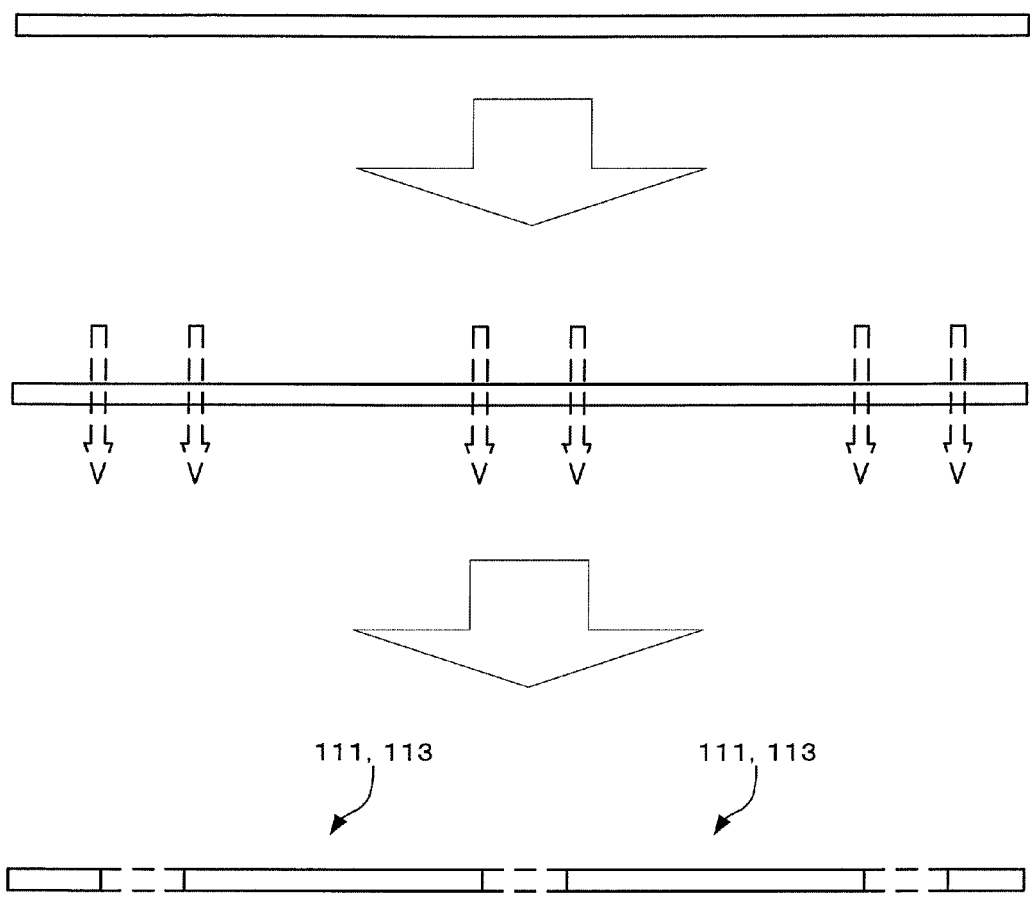
FIG. 7 are views illustrating steps to cut out first and second insulation layers from a wafer commonly used for multiple products; working on this FIG. 8 are views illustrating steps to cut out separators from a wafer commonly used for multiple products; working on this FIG. 9 are views illustrating steps to produce cores for rigid substrates.
Figure 8:
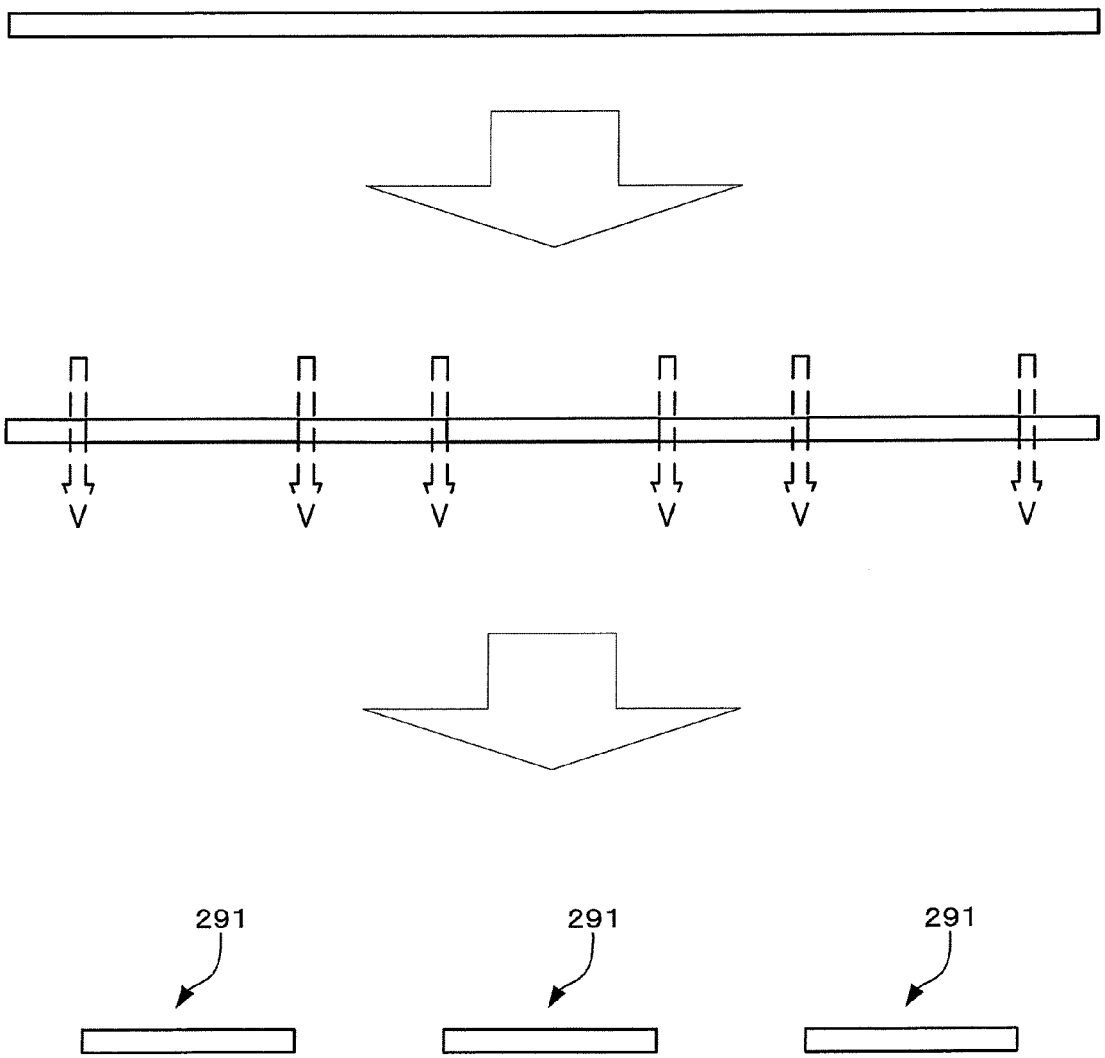

Next, flexible substrate 13 as manufactured above is bonded with each rigid substrate of first and second rigid substrates 11, 12. Before bonding, as shown in FIG. 7, for example, first and second insulation layers 111, 113 of a predetermined size are prepared by cutting a wafer commonly used for multiple products using a laser or the like. Also, as shown in FIG. 8, for example, separators 291 of a predetermined size are prepared by cutting a wafer commonly used for multiple products by a laser or the like.

Figure 9:
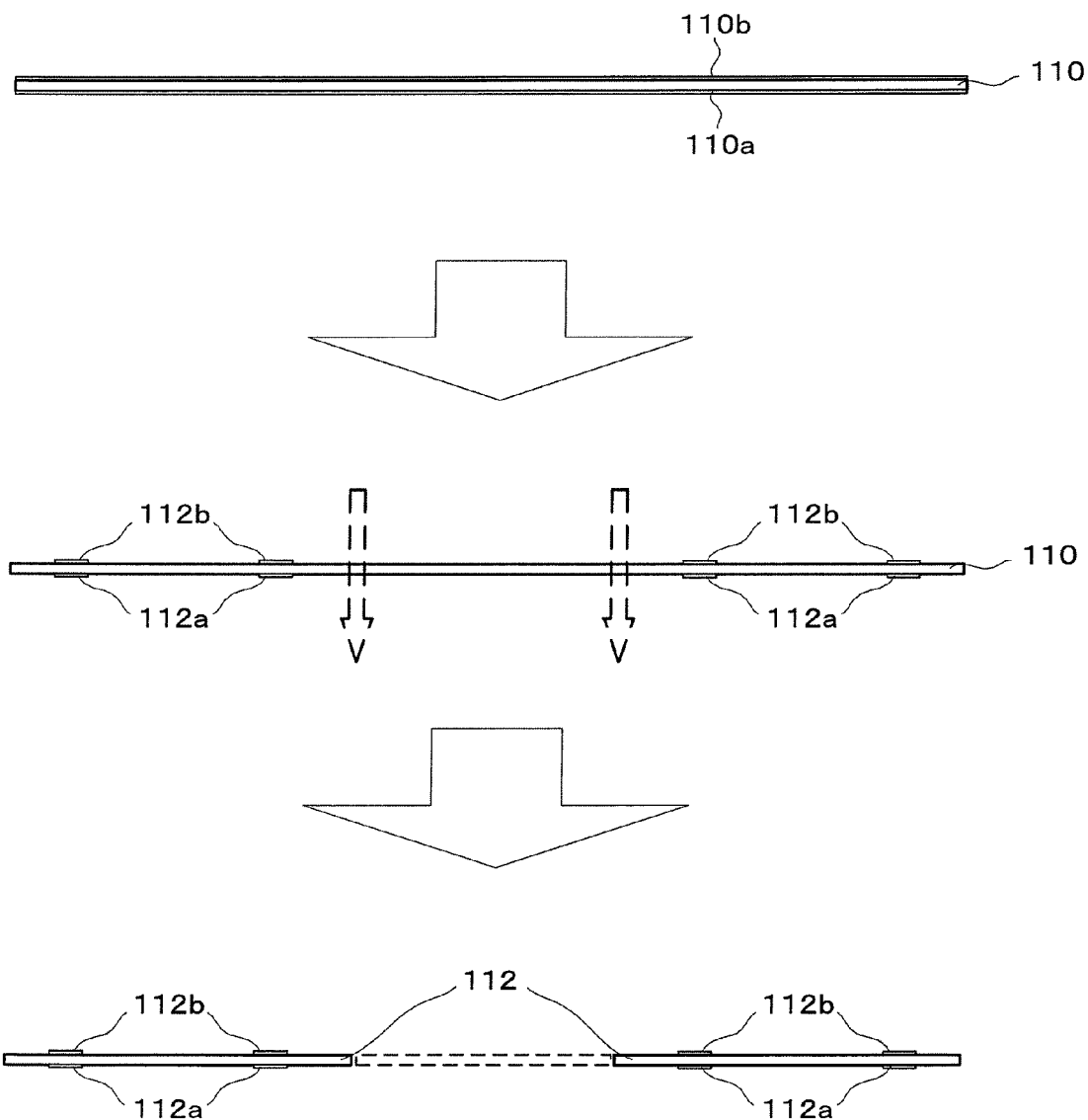

Also, rigid base material 112 that makes the core for rigid substrates 11, 12 is produced from wafer 110 commonly used for multiple products as shown in, for example, FIG. 9. Namely, after conductive films (110a, 110b) made of copper, for example, are formed on the top and bottom of wafer 110 respectively, conductive films (110a, 110b) are patterned to form conductive patterns (112a, 112b) through, for example, a predetermined lithography process (pretreatment, laminating, exposing to light, developing, etching, removing the film, inspecting inner layers and so forth). Then, using a laser or the like, a predetermined portion of wafer 110 is removed to obtain rigid base materials 112 for rigid substrates 11, 12. After that, a black-oxide treatment is conducted on rigid base material 112 as manufactured above.

Rigid base material 112 is formed, for example, with glass-epoxy base material of a thickness in the range of 50-150 μm, preferably an approximate thickness of 100 μm; first and second insulation layers 111, 113 are formed, for example, with a prepreg of a thickness in the range of 20-50 μm. Separator 291 is formed, for example, with a cured prepreg or polyimide film or the like. The thicknesses of first and second insulation layers 111, 113 are set at substantially the same thickness so as to make, for example, a symmetrical structure on the top and bottom of rigid substrates 11, 12. The thickness of separator 291 is set to be substantially the same thickness as that of second insulation layer 113. Also, the thickness of rigid base material 112 and the thickness of flexible substrate 13 are preferred to be made substantially the same. By doing so, resin will be filled in spaces formed between rigid base material 112 and coverlays 138, 139. Accordingly, flexible substrate 13 and rigid base material 112 may be bonded more securely.

Figure 10A:
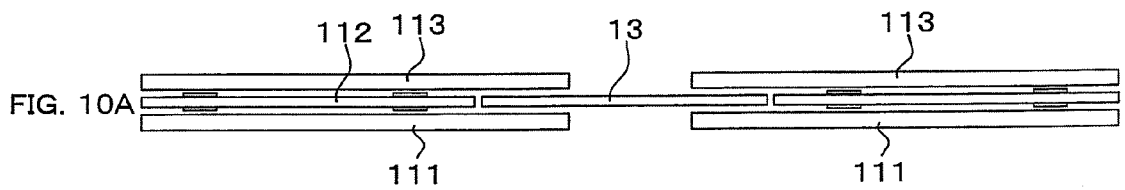
FIG. 10A is a view illustrating a step to form a first layer.

In the following, first and second insulation layers 111, 113, rigid base materials 112 and flexible substrate 13 that were cut in the process shown in FIGS. 6, 7, 9 are aligned and arranged, for example, as shown in FIG. 10A. During that time, each tip of flexible substrate 13 is sandwiched between first and second insulation layers 111, 113 and then aligned.

Figure 10B:
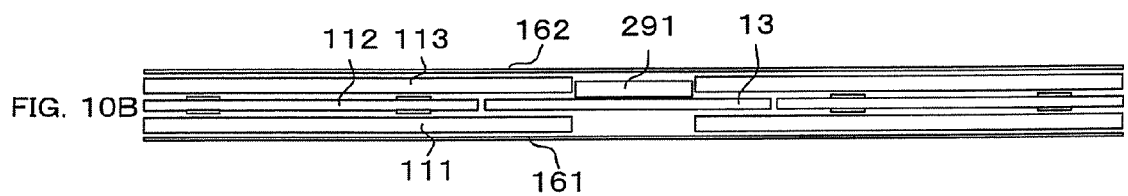
FIG. 10B is a view illustrating a step to form a first layer.

Furthermore, as shown in FIG. 10B, for example, separator 291 that was cut in the step shown in FIG. 8 is arranged side by side with second insulation layer 113 on one surface (for example, the upper surface) of flexible substrate 13 which is exposed between rigid substrate 11 and rigid substrate 12. Then, conductive films 161, 162 made of copper, for example, are disposed on the outside (both top and bottom). Separator 291 is secured using, for example, an adhesive agent. By making such a structure, since separator 291 supports conductive film 162, problems, such as broken copper foil caused by a plating solution that is seeped into the space between flexible substrate 13 and conductive film 162, may be prevented or suppressed.

Figure 10C:
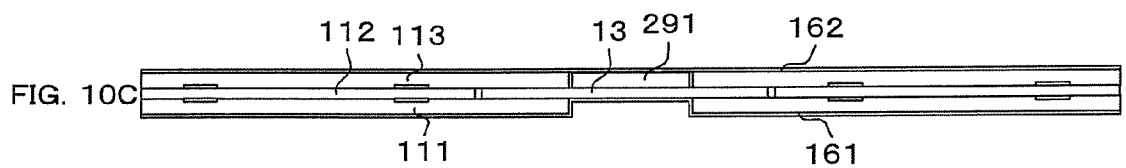
FIG. 10C is a view illustrating a step to form a first layer.

Next, the structure, as so aligned (FIG. 10B), is pressure-pressed as shown, for example, in FIG. 10C. During that time, resin 125 is squeezed from each prepreg that forms first and second insulation layers 111, 113. As shown in FIG. 4, the space between rigid base material 112 and flexible substrate 13 is filled by resin 125. As such, by filling the space with resin 125, flexible substrate 13 and rigid base material 112 are adhered securely. Such pressure-pressing is conducted using, for example, hydraulic pressing equipment, under the approximate conditions of temperature at 200° C., pressure at 40 kgf and pressing time of three hours.

In the following, the entire structure is heated or the like, the prepreg forming first and second insulation layers 111, 113 and resin 125 are cured and integrated. At that time, coverlays 138, 139 (FIG. 4) of flexible substrate 13 and first and second insulation layers 111, 113 are polymerized. By polymerizing the resin of insulation layers 111, 113, the surroundings of vias 141, 116 (they will be formed in the later process) are secured with resin, thus enhancing connection reliability of each connection section between vias 141 and conductive layer 132 (or between vias 116 and conductive layer 133).

Figure 10D:
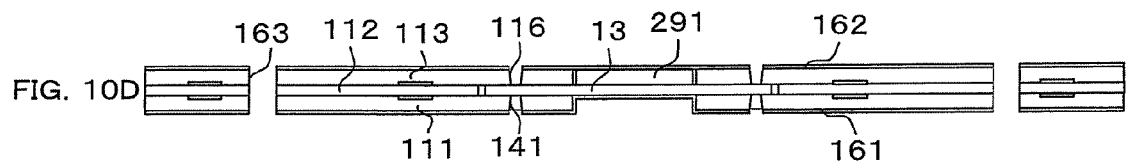
FIG. 10D is a view illustrating a step to form a first layer.

Next, after a predetermined pretreatment, for example, a $CO_2$ laser is beamed using $CO_2$ laser processing equipment to form through-holes 163 as shown in FIG. 10D. During that time, vias 116, 141 (for example, IVHs (Interstitial Via Holes)) are also formed to connect conductive layers 132, 133 of flexible substrate 13 (FIG. 4) and rigid substrates 11, 12 respectively.

Figure 10E:
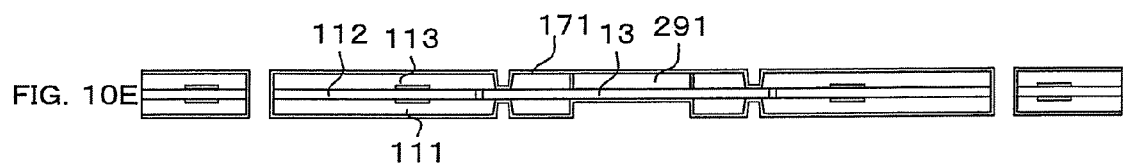
FIG. 10E is a view illustrating a step to form a first layer.

In the following, after conducting desmear treatment (removing smears) and soft etching, for example, as shown in FIG. 10E, PN plating (for example, chemical copper plating and electrical copper plating) is performed to plate copper on the entire surfaces of the structure. The copper from such copper plating and already existing conductive films 161, 162 are integrated to form copper films 171 on the entire surfaces of the substrate including the inner surfaces of vias 116, 141 and the inner surfaces of through-holes 163. During that time, since flexible substrate 13 is covered by conductive films 161, 162, it is not directly exposed to the plating solution. Therefore, flexible substrate 13 will not be damaged by the plating solution.

Figure 10F:
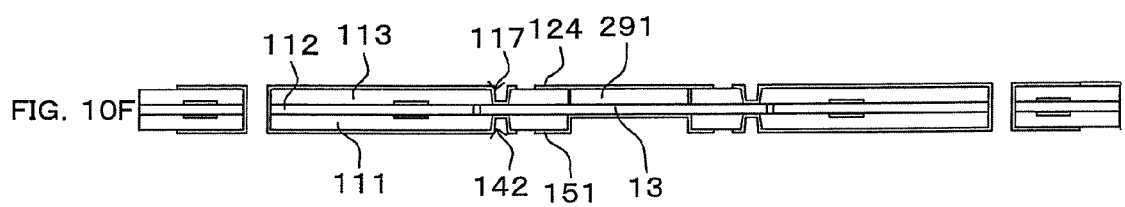
FIG. 10F is a view illustrating a step to form a first layer.

In the following, copper films 171 on the surfaces of the substrate are patterned, for example, as shown in FIG. 10F, through a predetermined lithography process (pretreatment, laminating, exposing to light, developing, etching, removing the film, inspecting inner layers and so forth). By doing so, wiring patterns 142, 117 and extended patterns 143, 118 are formed to be connected to conductive layers 132, 133 of flexible substrate 13 (FIG. 4) respectively. At that time, copper foil is kept on each tip of first and second insulation layers 111, 113 on the side of flexible substrate 13. After that, a black oxide treatment is performed on the resultant structure.

Figure 11A:
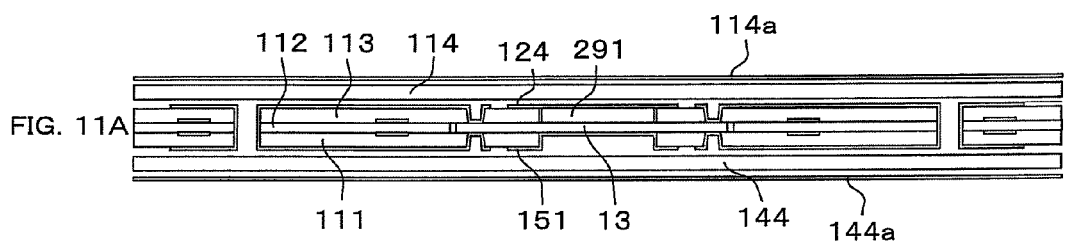
FIG. 11A is a view illustrating a step to form a second layer.
Figure 11B:
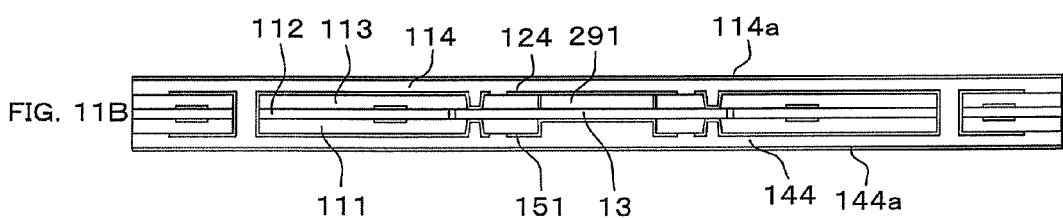
FIG. 11B is a view illustrating a step to form a second layer.

In the following, as shown in FIG. 11A, for example, on the top and bottom of the resultant structure, first and second upper-layer insulation layers 144, 114 are disposed respectively. Then, conductive films (114a, 144a) made of copper, for example, are further disposed outside those layers. After that, as shown in FIG. 11B, the structure is pressure-pressed. At that time, vias 116, 141 are filled with the resin squeezed from the prepreg each forming first and second upper-layer insulation layers 114, 144. Then, the prepreg and the resin in the vias are set through thermal treatment or the like to cure first and second upper-layer insulation layers 144, 114.

Figure 11C:
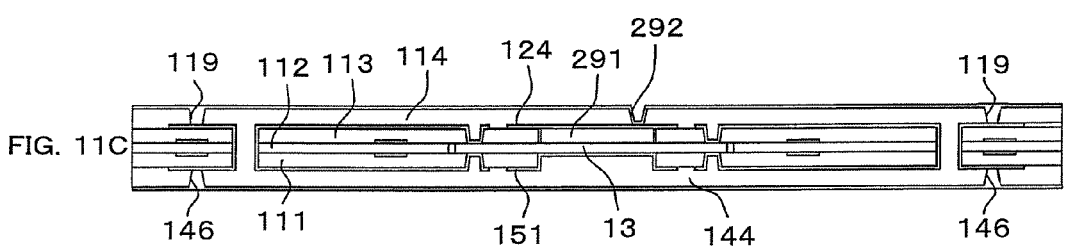
FIG. 11C is a view illustrating a step to form a second layer.

In the following, conductive films (114a, 144a) are made thinner to a predetermined thickness by half etching, for example. Then, after a predetermined pretreatment, using a laser, for example, vias 146 are formed in first upper-layer insulation layer 144, and vias 119 and cutoff line 292 are formed in second upper-layer insulation layer 114. Then, after conducting desmear treatment (removing smears) and soft etching, for example, as shown in FIG. 11C, conductors are formed in the interiors of vias 146, 119 and cutoff line 292 through PN plating (for example, chemical copper plating and electrical copper plating). Such conductors may also be formed by printing conductive paste (for example, thermosetting resin containing conductive particles) by screen printing.

Figure 11D:
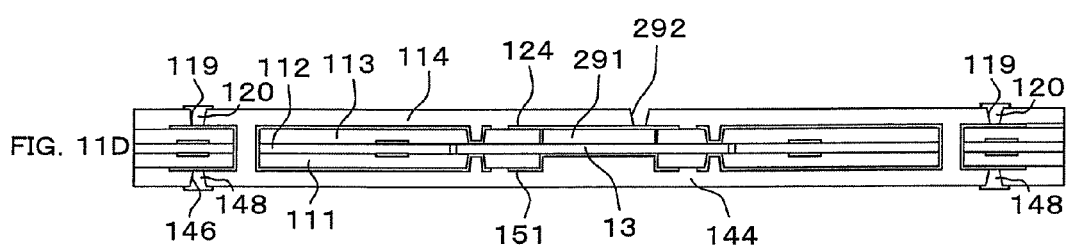
FIG. 11D is a view illustrating a step to form a second layer.

In the following, the conductive films on the surfaces of the substrate are made thinner to a predetermined thickness by half etching, for example. Then, the conductive films on the surfaces of the substrate are patterned through, for example, a predetermined lithography process (pretreatment, laminating, exposing to light, developing, etching, removing the film, inspecting inner layers and so forth) as shown in FIG. 11D. By doing so, conductors 148, 120 are formed. Also, the conductor in cutoff line 292 is removed by etching. Then, a black oxide treatment is performed on the resultant structure.

Here, before describing the next process, a step conducted prior to such process is described. Namely, prior to the next process, as shown in FIG. 12, a wafer used commonly for multiple products is cut using a laser or the like, for example, to form third and fourth upper-layer insulation layers 145, 115 of a predetermined size.

Figure 12:
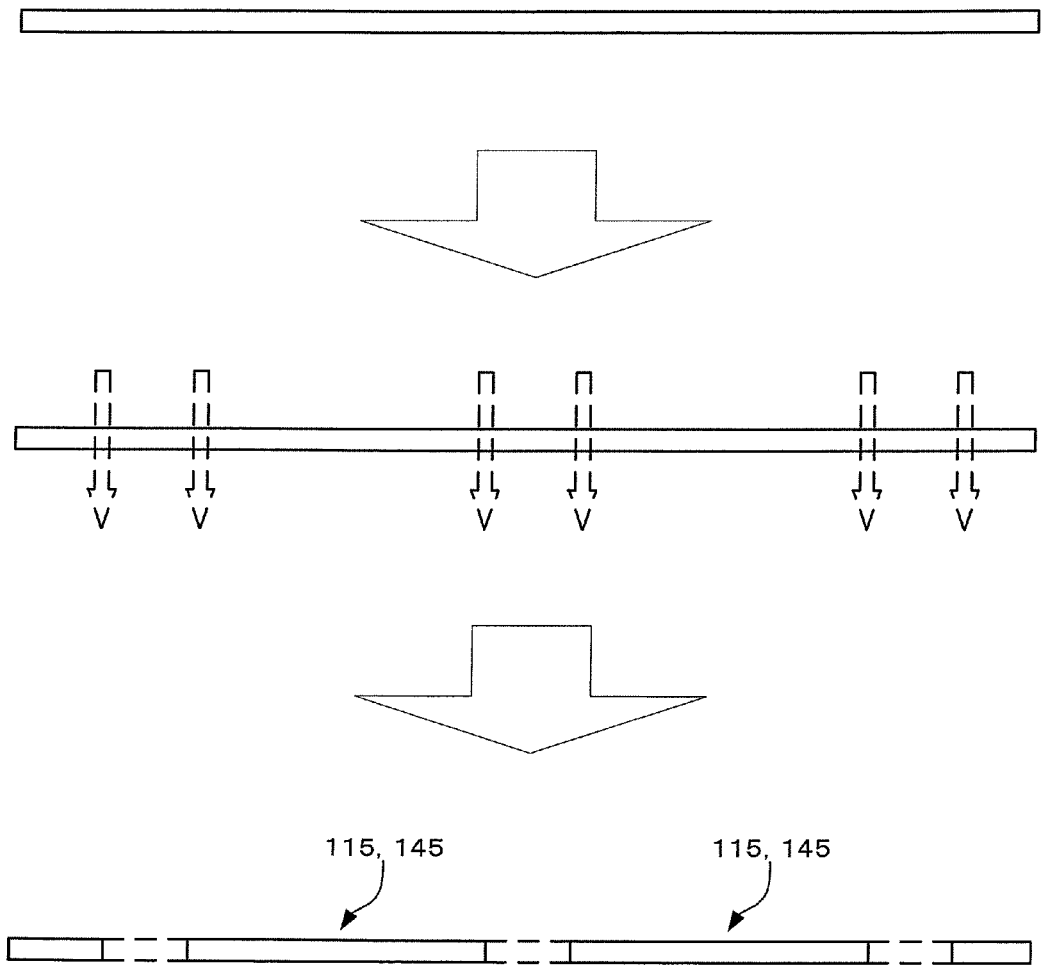
FIG. 12 are views illustrating steps to cut out third and fourth upper-layer insulation layers from a wafer commonly used for multiple products.
Figure 13A:
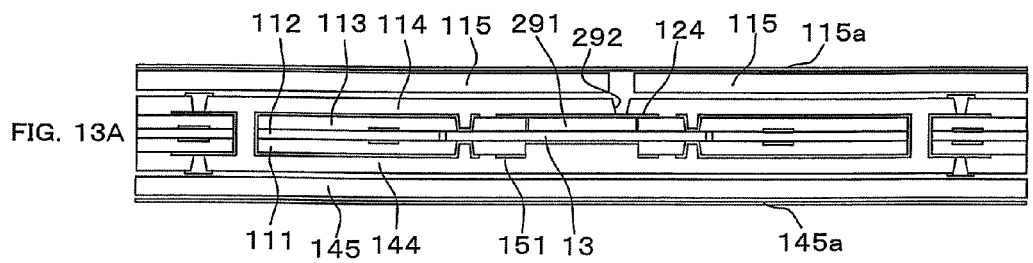
FIG. 13A is a view illustrating a step to form a third layer.

Then, in the following process, as shown in FIG. 13A, on the top and bottom of the substrate, third and fourth upper-layer insulation layers 145, 115, which were cut in the process shown in FIG. 12, are disposed. Then, on their outside (on both top and bottom), conductive films (145a, 115a) made of copper, for example, are disposed. As shown in FIG. 13A, fourth upper-layer insulation layer 115 is disposed, but to leave a gap over cutoff line 292. After that, by heating or the like, third and fourth upper-layer insulation layers 145, 115 are cured. Third and fourth upper-layer insulation layers 145, 115 are each formed with a regular prepreg made, for example, by impregnating glass cloth with resin.

Figure 13B:
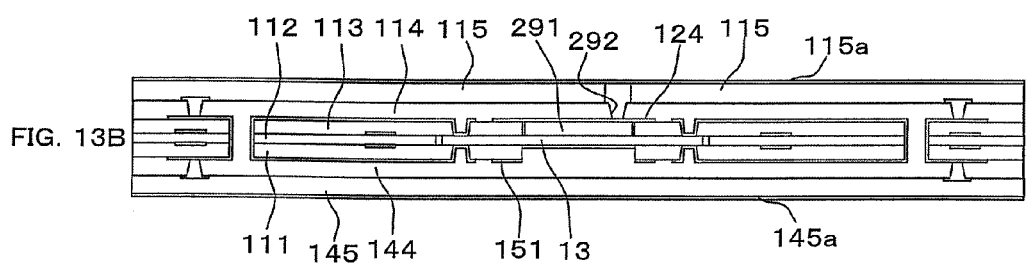
FIG. 13B is a view illustrating a step to form a third layer.
Figure 13C:
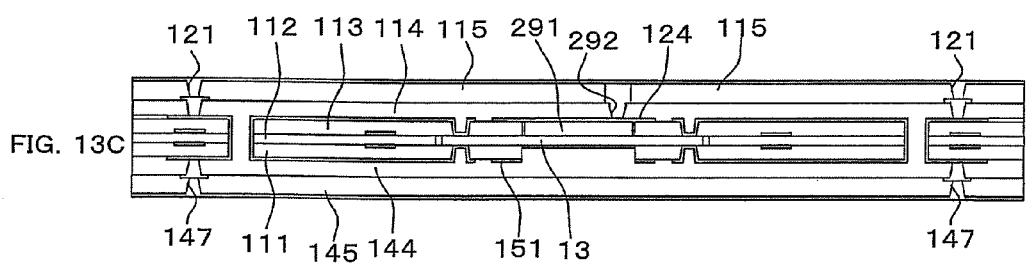
FIG. 13C is a view illustrating a step to form a third layer.

In the following, the resultant structure is pressed as shown in FIG. 13B. After that, conductive films (145a, 115a) are each made thinner to a predetermined thickness by half etching, for example. Then, after conducting pretreatment, vias 147, 121 are formed in third and fourth upper-layer insulation layers 145, 115 respectively using a laser, for example. After conducting a desmear process (removing smears) and soft etching, vias 147, 121 are filled with conductor, for example, as shown in FIG. 13C, through PN plating (for example, chemical copper plating and electrical copper plating). In doing so, by filling the interiors of vias 147, 121 with the same conductive paste material, connection reliability may be enhanced when thermal stresses are exerted on vias 147, 121. The conductor may also be formed by printing conductive paste (such as thermosetting resin containing conductive particles) by, for example, screen printing.

Figure 13D:
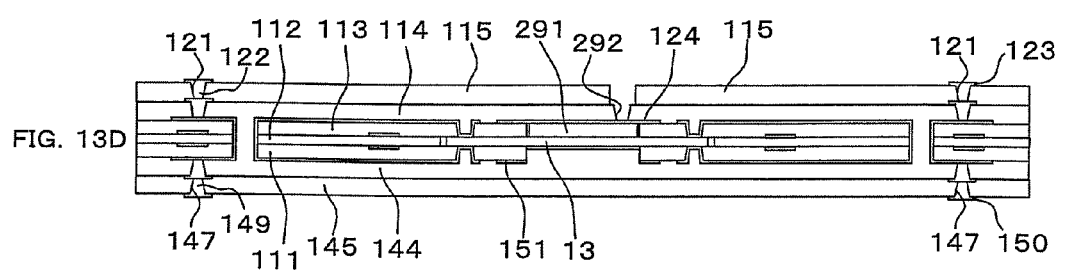
FIG. 13D is a view illustrating a step to form a third layer.

In the following, as shown in FIG. 13D, the surfaces of the substrate are made thinner to a predetermined thickness by half etching, for example. After that, the copper films on the substrate surfaces are patterned, for example, through a predetermined lithography process (pretreatment, laminating, exposing to light, developing, etching, removing the film, inspecting inner layers and so forth). In doing so, conductors 149, 122 and conductive patterns 150, 123 are formed. Then, a black oxide treatment is performed on the resultant structure.

Next, as shown in FIG. 14A, fifth and sixth upper-layer insulation layers 172, 173 are disposed on the top and bottom of the resultant structure, then on its outside (on both top and bottom), conductive films (172a, 173a) made of copper, for example, are disposed. Fifth and sixth upper-layer insulation layers 172, 173 are formed, for example, with a prepreg made by impregnating glass cloth with resin.

In the following, the structure is pressed as shown in FIG. 14B. After that, conductive films (172a, 173a) are made thinner to a predetermined thickness by half etching, for example. Then, after conducting a predetermined pretreatment, vias 174, 175 are formed respectively in fifth and sixth upper-layer insulation layers 172, 173 by laser beams or the like. Also, as shown in FIG. 14C, the insulation layer in each portion indicated by the broken lines in FIG. 14B, namely, the insulation layer at the edges of separator 291 (the border portions between second insulation layer 113 and separator 291), is removed, and cutoff lines (notches) (294a-294c) are formed. At that time, cutoff lines (294a-294c) are formed (cut) using, for example, conductive patterns 151, 124 as a stopper. During that time, the energy or beam time may be adjusted so that a certain amount of conductive patterns 151, 124, which are used as a stopper, will be cut.

In the following, by performing PN plating (for example, chemical copper plating and electrical copper plating), conductors are formed on the entire surfaces of the substrate including the interiors of vias 174, 175. Then, the copper foils on the substrate surfaces are made thinner to a predetermined thickness by half etching, for example. After that, the copper foils on the substrate surfaces are patterned, for example, through a predetermined lithography process (pretreatment, laminating, exposing to light, developing, etching, removing the film and so forth). In doing so, conductive patterns 176, 177 are formed as shown in FIG. 14D. After forming the conductive patterns, those patterns are inspected.

In the following, solder resists are formed on the entire surfaces of the substrate by screen printing, for example. Then, as shown in FIG. 14E, the solder resists are patterned through a predetermined lithography process. After that, patterned solder resists 298, 299 are set, for example, by heating or the like.

In the following, after drilling and outline processing are conducted around the edges of separator 291 (see broken lines in FIG. 14B), structures 301, 302 are removed by tearing them off from flexible substrate 13 as shown in FIG. 15A. During that time, separation is easily done because of separator 291. Also, when structures 301, 302 are separated (removed) from the rest, since conductive patterns (151, 124) are not adhered, but are only pressed onto coverlays 138, 139 of flexible substrate 13 (see FIG. 10C), conductive patterns 124, 151 are also removed along with structures 301, 302.

As described, by exposing the center portion of flexible substrate 13, spaces (regions (R1, R2)) which allow flexible substrate 13 to warp (bend) are formed on the top and bottom (in the direction where insulation layers are laminated) of flexible substrate 13. By doing so, flex-rigid wiring board 10 may be bent or the like at those portions of flexible substrate 13.

At the tip of each insulation layer facing the removed areas (region (R1, R2)), conductive patterns 124, 151 remain as shown, for example, in broken lines in FIG. 15B. The remaining copper is removed according to requirements by, for example, mask etching (pretreatment, laminating, exposing to light, developing, etching, removing the film and so forth) as shown in FIG. 15C.

In the following, electrodes 178, 179 are formed by chemical gold plating, for example. After that, through outline processing, warp correction, conductivity testing, exterior inspection and final inspection, flex-rigid wiring board 10 is completed as shown earlier in FIG. 3. As described above, flex-rigid wiring board 10 has a structure in which the tips of substrate 13 are sandwiched between the core sections (first and second insulation layers 111, 113) of rigid substrates 11, 12, and lands of rigid substrates 11, 12 and connection pads of the flexible substrate are connected respectively through plated metallic layers.

On flex-rigid wiring board 10, specifically on each surface of rigid substrates 11, 12, electronic components 501, 502 are mounted respectively. After the board is sealed in packaging 101 as shown earlier in FIG. 5, and mounted on motherboard 100, an electronic device according to an embodiment of the present invention is completed.

In the above, a flex-rigid wiring board and an electronic device according to an embodiment of the present invention were described. However, the present invention is not limited to such an embodiment.

Figure 16:
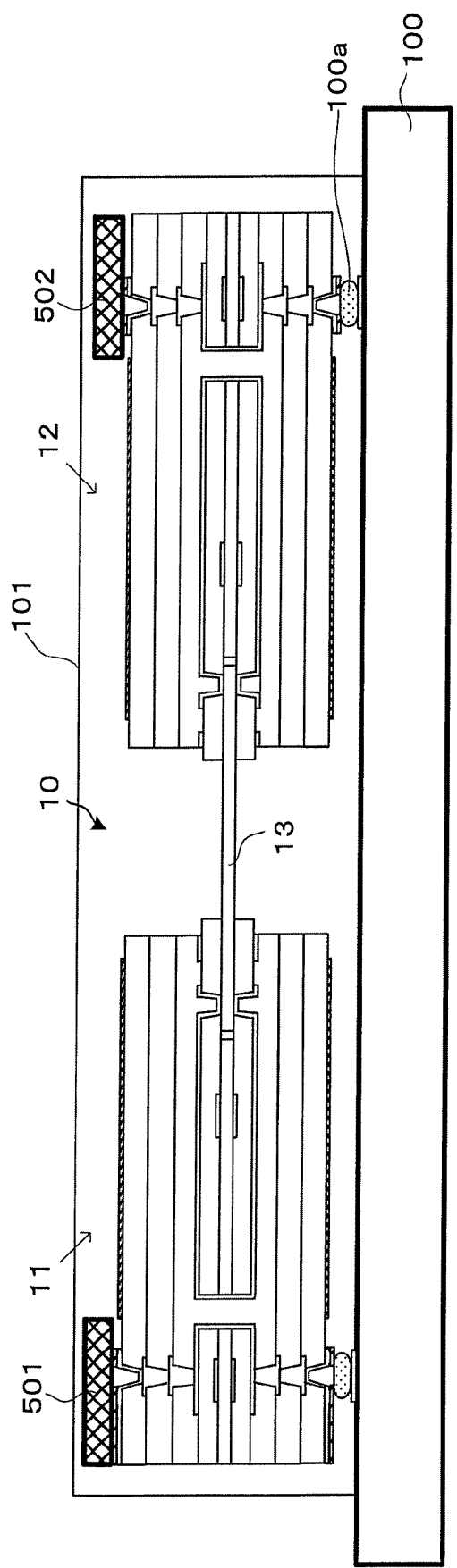
FIG. 16 is a view illustrating a modified example of the electronic device.
Figure 17:
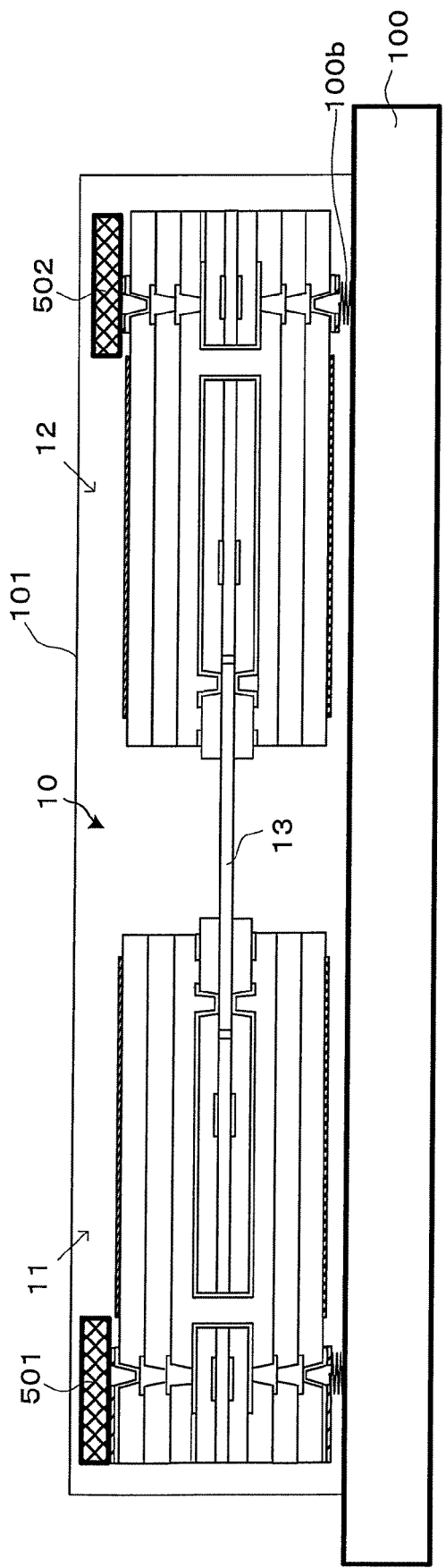
FIG. 17 is a view illustrating another modified example of the electronic device.
Figure 18:
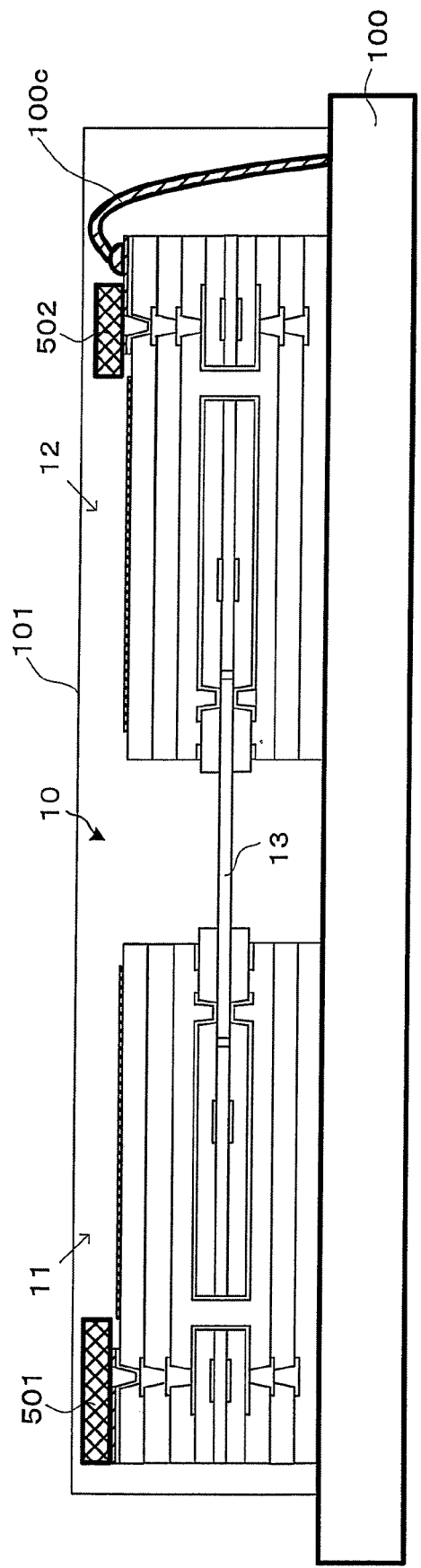
FIG. 18 is a view illustrating yet another modified example of the electronic device.
Figure 19:
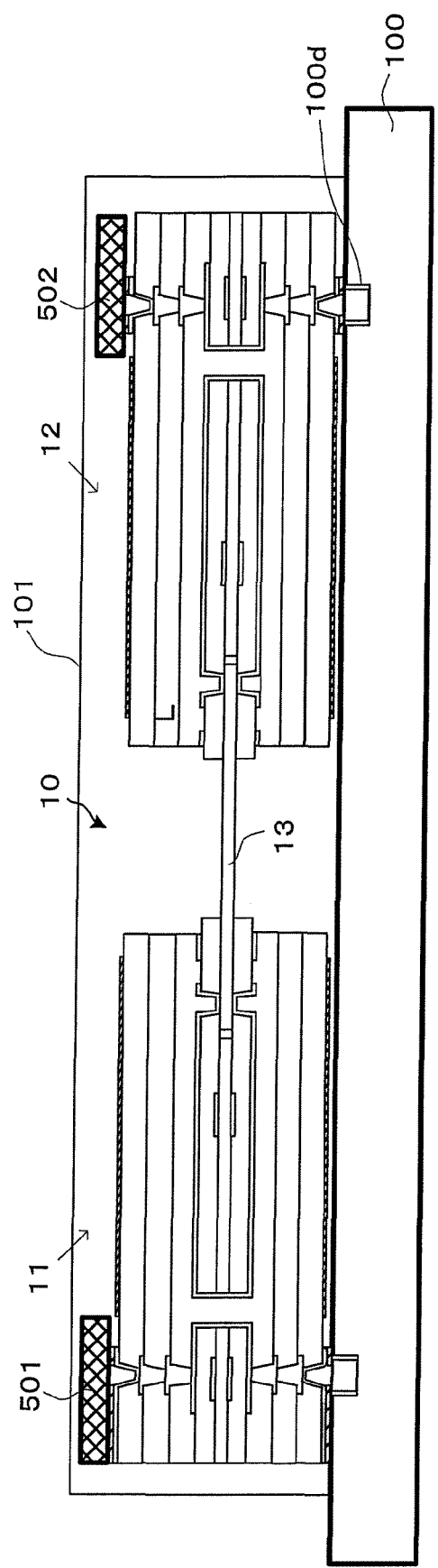
FIG. 19 is a view illustrating yet another modified example of the electronic device.

When mounting flex-rigid wiring board 10 on motherboard 100, a bare chip may be mounted directly, not by means of packaging 101. For example, as shown in FIG. 16, a bare chip may be mounted on motherboard 100 by a flip-chip connection using, for example, conductive adhesive agent (100a). Alternatively, for example, as shown in FIG. 17, a bare chip may be mounted on motherboard 100 by means of spring (100b). Also alternatively, for example, as shown in FIG. 18, a bare chip may be mounted on motherboard 100 by wire bonding through wiring (100c). Also alternatively, for example, as shown in FIG. 19, build-up vias are formed all the way to the upper layer of motherboard 100, and both substrates may be electrically connected by means of section through-holes (plated through-holes) (100d). Also, both substrates may be electrically connected through connectors. Any method may be employed for mounting both substrates.

Furthermore, the quality or material of the electrodes and wiring for electrical connection of both substrates is not limited to a specific type. For example, both substrates may be electrically connected by ACF (Anisotropic Conductive Film) connection or Au—Au connection. It may be easier by ACF connection to align flex-rigid wiring board 10 and motherboard 100. Also, using an Au—Au connection, connected sections may be formed to be corrosion-resistant.

Electronic components 503, 504 may be placed into flex-rigid wiring board 10 as shown in FIG. 20. By using flex-rigid wiring board 10 with built-in electronic components, electronic devices may be made highly functional. Here, electronic components 503, 504 may be, for example, active components such as an IC circuit or the like, or passive components such as a resistor, condenser (capacitor) or coil.

In the above embodiment, the option exists to modify the material and size of each layer and the number of layers. For example, instead of a prepreg, an RCF (Resin Coated Copper Foil) may be used.

Figure 21A:
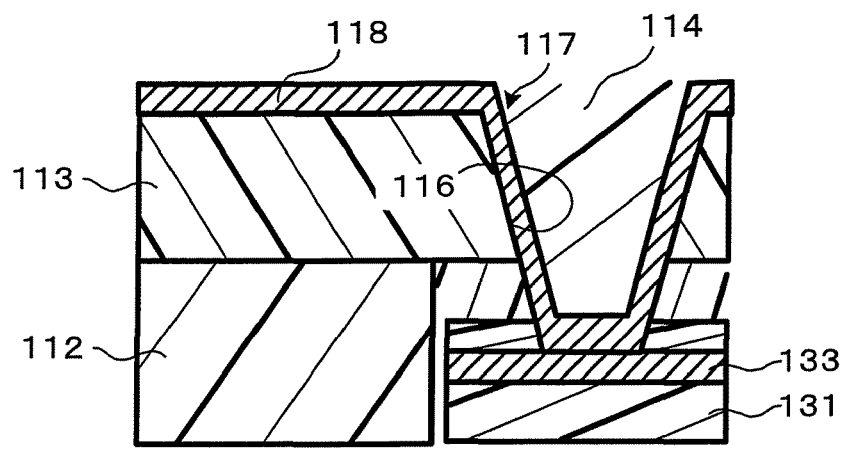
FIG. 21A is a view showing a connection structure of between rigid substrate and a flexible substrate.
Figure 21B:
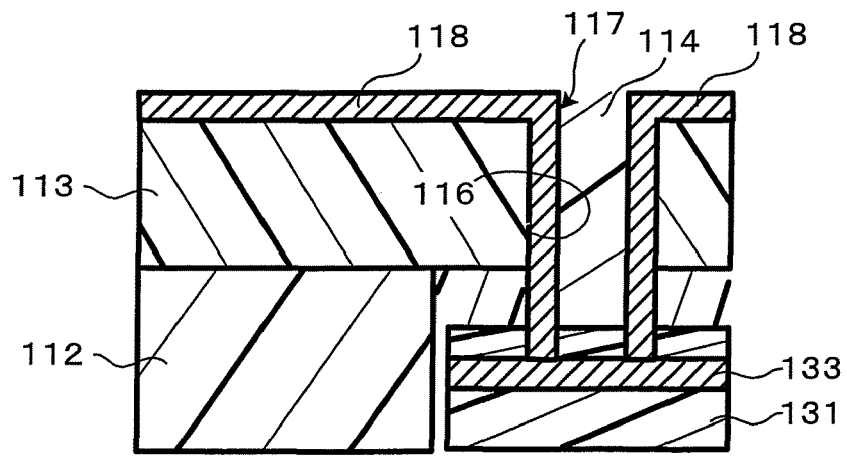
FIG. 21B is a view showing a modified connection structure between a rigid substrate and a flexible substrate.
Figure 21C:
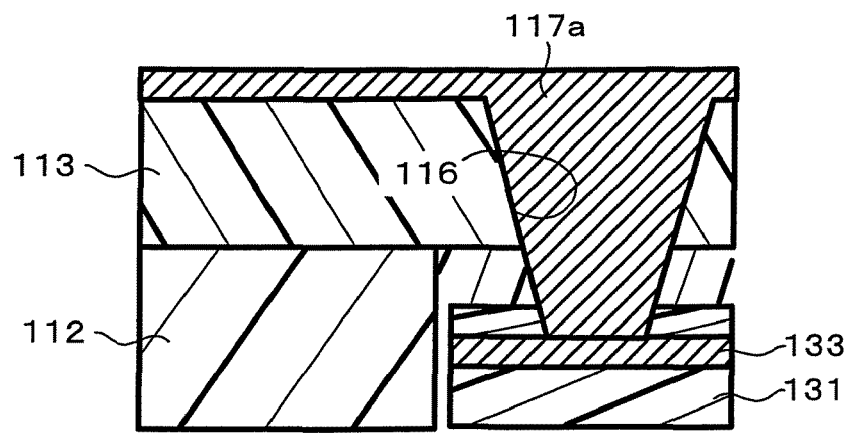
FIG. 21C is a view showing another modified connection structure between a rigid substrate and a flexible substrate.

Also, in the above embodiment, as shown in FIG. 21A, rigid substrates 11, 12 and flexible substrate 13 were electrically connected respectively through filled conformal vias in second upper-layer insulation layer 114 (insulation resin) (see FIG. 4 for detail). However, the present invention is not limited to such. For example, as shown in FIG. 21B, both substrates may be connected by through-holes. However, in such a structure, the impact from being dropped or the like may concentrate in the inner-wall portions of the through-holes, and thus cracks may more easily occur at the shoulder sections of through-holes, compared with conformal vias. Other than such, for example, as shown in FIG. 21C, both substrates may be connected by filled vias. In such a structure, impacts from being dropped or the like may be exerted on the entire vias, thus suppressing cracks compared with conformal vias. The interiors of such conformal vias and through-holes may be filled with conductive resin.

Figure 22:
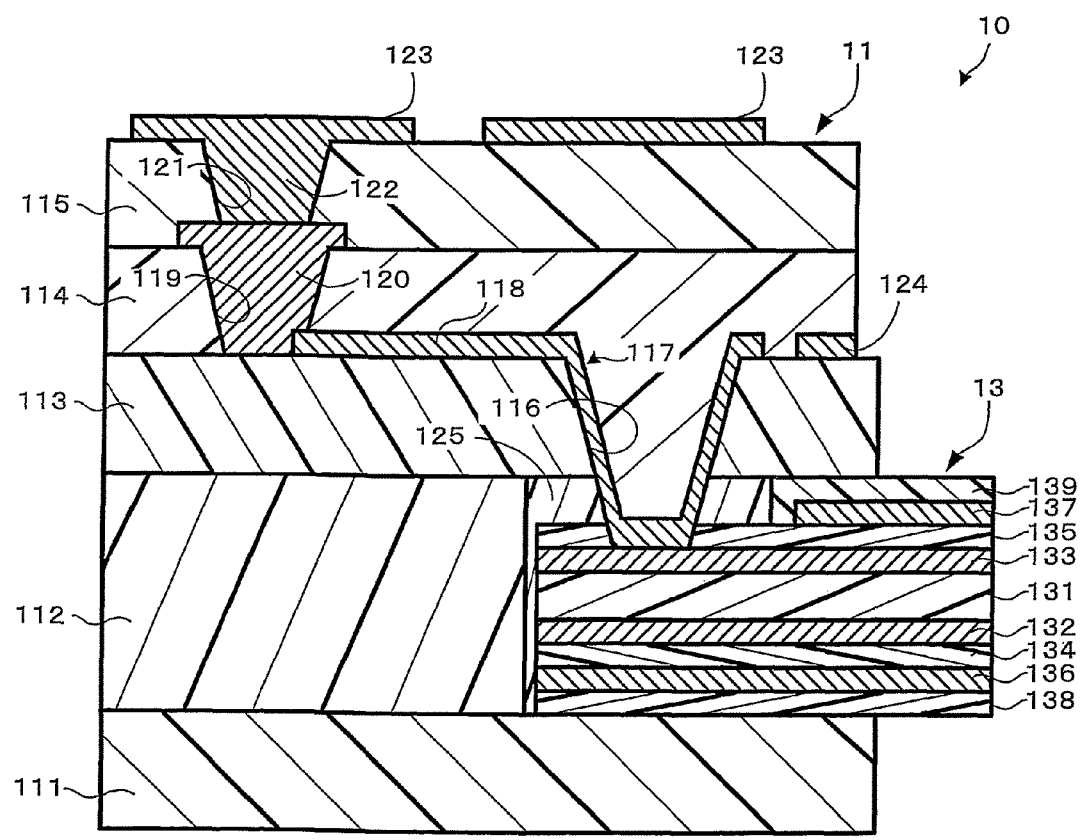
FIG. 22 is a view illustrating a modified example of the flex-rigid wiring board.
Figure 23:
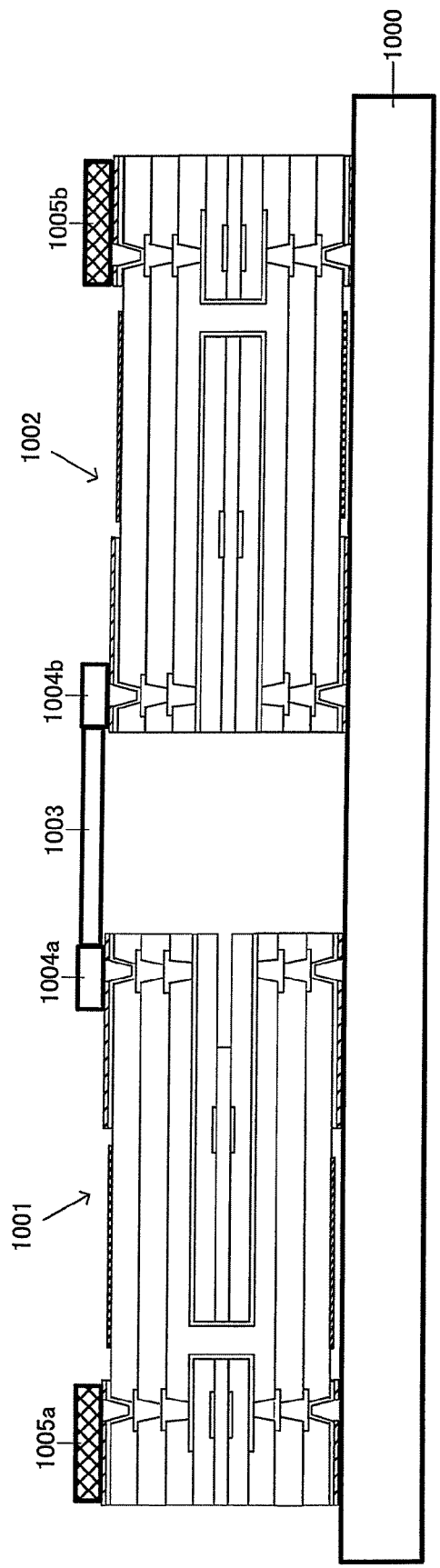
FIG. 23 is a cross-sectional view showing an example of a flex-rigid wiring board with a mid-air highway structure.

Also, as shown in FIG. 22, rigid substrate 11 may have conductor (wiring layers) only on either the top or the bottom of the core (the same in rigid substrate 12). Also, three or more rigid substrates may be connected by flexible substrates.

The structure of the above embodiment or modified examples may be put together (used together) with the above-described mid-air highway structure.

A flex-rigid wiring board according to an embodiment of the present invention has a flexible printed wiring board with a first conductive pattern and a rigid printed wiring board with a second conductive pattern. An insulation layer covers at least part of the flexible printed wiring board and at least part of the rigid printed wiring board while exposing at least part of the flexible printed wiring board, a first connection terminal for mounting the flex-rigid wiring board onto a motherboard, and a second connection terminal for mounting an electronic component onto the flex-rigid wiring board, where the second conductive pattern is formed on the insulation layer and the first conductive pattern and the second conductive pattern are connected through a plated metallic layer that penetrates the insulation layer.

The flexible wiring board may be structured in such a way that it is partially a flex-rigid wiring board.

The rigid printed wiring board may be structured in such a way that it is arranged horizontally to the flexible printed wiring board.

An electronic device according to another embodiment of the present invention has a motherboard and a flex-rigid wiring board. The flex-rigid wiring board is made up of a flexible printed wiring board having a first conductive pattern, a rigid printed wiring board having a second conductive pattern, and an insulation layer covering at least part of the flexible printed wiring board and at least part of the rigid printed wiring board while exposing at least part of the flexible printed wiring board. The second conductive pattern is formed on the insulation layer. The first conductive pattern and the second conductive pattern are connected through a plated metallic layer that penetrates the insulation layer; on a surface of the motherboard, at least one of the flex-rigid wiring boards is mounted. On a surface of the rigid printed wiring board, at least one electronic component is mounted.

The structure may be formed in such a way that multiple electronic components are mounted on a surface of the rigid printed wiring board; the multiple electronic components are electrically connected to each other through a signal line that is formed with the first conductive pattern and the second conductive pattern; the flex-rigid wiring board has a through-hole that electrically interconnects the conductive patterns on both surfaces of the substrate; and, in the first and second conductive patterns, at least the signal line electrically connects the multiple electronic components with each other using a route that avoids the through-hole.

The structure may be formed in such a way that the second conductive pattern forms a power-source line which provides a power source for the multiple electronic components from the mother board; and, in the second conductive pattern, at least the power-source line passes through the through-hole and provides a power source for the multiple electronic components.

An electronic device according to yet another embodiment of the present invention has a flex-rigid wiring board. The flex-rigid wiring board is made up of a flexible printed wiring board having a first conductive pattern, a rigid printed wiring board having a second conductive pattern, and an insulation layer covering at least part of the flexible printed wiring board and at least part of the rigid printed wiring board while exposing at least part of the flexible printed wiring board. The second conductive pattern is formed on the insulation layer. The first conductive pattern and the second conductive pattern are connected through a plated metallic layer that penetrates the insulation layer. On a surface of the rigid printed wiring board, at least one electronic component is mounted. A connection terminal is formed on the flex-rigid wiring board to mount the flex-rigid wiring board onto a mother board.

An electronic device according to still another embodiment of the present invention has a flex-rigid wiring board. The flex-rigid wiring board is made up of a flexible printed wiring board having a first conductive pattern, a rigid printed wiring board having a second conductive pattern, and an insulation layer covering at least part of the flexible printed wiring board and at least part of the rigid printed wiring board while exposing at least part of the flexible printed wiring board. The second conductive pattern is formed on the insulation layer. The first conductive pattern and the second conductive pattern are connected through a plated metallic layer that penetrates the insulation layer. The rigid printed wiring board has at least one built-in electronic component. On a surface of the rigid printed wiring board, at least one electronic component is mounted. A connection terminal is formed on the flex-rigid wiring board to mount the flex-rigid wiring board onto a mother board.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board comprising:
   a flexible printed wiring board having first and second ends, and comprising a first conductive layer;
   a rigid printed wiring board having a rigid base material, an insulation layer over the rigid base material and a second conductive layer formed over the insulation layer,
   wherein the insulation layer covering at least a portion of said first end of the flexible printed wiring board and at least a portion of the rigid base material while exposing at least a portion of the flexible printed wiring board, and the first conductive layer and the second conductive layer are connected through a plated metallic layer penetrating through the insulation layer and through a portion of the flexible printed wiring board;

a connection terminal formed on a surface of the rigid printed wiring board and configured to mount an integrated circuit processing chip;

another rigid printed wiring board connected to said second end of the flexible printed wiring board and having another surface which faces a same direction as said surface of the rigid printed wiring board; and another connection terminal formed on said another surface of the another rigid printed wiring board and configured to mount an integrated circuit memory chip, the another connection terminal being electrically connected to the first conductive layer of the flexible printed wiring board such that the connection terminal of the rigid wiring board is electrically connected to the another connection terminal of the another rigid wiring board.

2. The flex-rigid wiring board according to claim 1, wherein the plated metallic layer forms a via structure through the insulation layer.

3. The flex-rigid wiring board according to claim 2, wherein the via structure is filled with a resin.

4. The flex-rigid wiring board according to claim 1, wherein the rigid printed wiring board is arranged horizontally to the flexible printed wiring board.

5. The flex-rigid wiring board of claim 1, wherein said plated metallic layer penetrates a resin area and an insulation layer of the flexible printed wiring board to connect to the first conductive layer.

6. An electronic device comprising:
a motherboard; and
a flex-rigid wiring board mounted on a surface of the motherboard and comprising a flexible printed wiring board having first and second ends, and a rigid printed wiring board and another rigid printed wiring board connected to said first and second ends respectively, wherein:
the flexible printed wiring board has a first conductive layer,
the rigid printed wiring board has a rigid base material,
an insulation layer over the rigid base material and a second conductive layer formed over the insulation layer, the insulation layer covers at least a portion of the first end of the flexible printed wiring board and at least a portion of the rigid base material while exposing at least a portion of the flexible printed wiring board, and the first conductive layer and the second conductive layer are connected through a plated metallic layer penetrating through the insulation layer and through a portion of the flexible printed wiring board,
a connection terminal formed on a surface of the rigid printed wiring board and configured to mount an integrated circuit processing chip;
said another rigid printed wiring board having another surface which faces a same direction as said surface of the rigid printed wiring board; and
another connection terminal formed on said another surface of the another rigid printed wiring board and configured to mount an integrated circuit memory chip, the another connection terminal being electrically connected to the first conductive layer of the flexible printed wiring board such that the connection terminal of the rigid wiring board is electrically connected to the another connection terminal of the another rigid wiring board.

7. The electronic device according to claim 6, further comprising a first connection terminal formed over the rigid printed wiring board and mounting the flex-rigid wiring board onto the motherboard.

8. The electronic device according to claim 6, further comprising:
an electronic component; and
a second connection terminal formed over the rigid printed wiring board and mounting the electronic component onto the flex-rigid wiring board.

9. The electronic device according to claim 6, further comprising an electronic component mounted on a surface of the rigid printed wiring board.

10. The electronic device according to claim 6, wherein the plated metallic layer forms a via structure through the insulation layer.

11. The electronic device according to claim 10, wherein the via structure is filled with a resin.

12. The electronic device according to claim 6, wherein the rigid printed wiring board is arranged horizontally to the flexible printed wiring board.

13. The electronic device according to claim 6, wherein the first conductive layer and the second conductive layer include a signal line for electrically connecting a plurality of electronic components formed over the flex-rigid wiring board.

14. The flex-rigid wiring board of claim 6, wherein said plated metallic layer penetrates a resin area and an insulation layer of the flexible printed wiring board to connect to the first conductive layer.

15. An electronic device comprising:
a flex-rigid wiring board comprising a flexible printed wiring board and a rigid printed wiring board, the flexible printed wiring board having first and second ends, and a rigid printed wiring board and another rigid printed wiring board connected to said first and second ends respectively;
an electronic component mounted over a surface of the rigid printed wiring board; wherein:
the flexible printed wiring board has a first conductive layer, the rigid printed wiring board has a rigid base material, an insulation layer over the rigid base material and a second conductive layer formed over the insulation layer, the insulation layer covers at least a portion of the flexible printed wiring board and at least a portion of the rigid base material while exposing at least a portion of the flexible printed wiring board, and the first conductive layer and the second conductive layer are connected through a plated metallic layer penetrating through the insulation layer and through a portion of the flexible printed wiring board,
a connection terminal formed on a surface of the rigid printed wiring board and configured to mount an integrated circuit processing chip;
said another rigid printed wiring board having another surface which faces a same direction as said surface of the rigid printed wiring board; and
another connection terminal formed on said another surface of the another rigid printed wiring board and configured to mount an integrated circuit memory chip, the another connection terminal being electrically connected to the first conductive layer of the flexible printed wiring board such that the connection terminal of the rigid wiring board is electrically connected to the another connection terminal of the another rigid wiring board.

16. The electronic device according to claim 15, further comprising a second electronic component provided in the rigid printed wiring board.

17. The electronic device according to claim 15, further comprising a second connection terminal formed on the rigid printed wiring board and mounting the electronic component on the surface of the flex-rigid wiring board.

18. The electronic device according to claim 15, wherein the plated metallic layer forms a via structure through the insulation layer.

19. The electronic device according to claim 18, wherein the via structure is filled with a resin.

20. The electronic device according to claim 18, wherein the rigid printed wiring board is arranged horizontally to the flexible printed wiring board.

21. The electronic device according to claim 15, wherein the first conductive layer and the second conductive layer include a signal line for electrically connecting a plurality of electronic components formed over the flex-rigid wiring board.

22. The electronic device according to claim 15, wherein the flex-rigid wiring board includes a through-hole structure for electrically connecting the second conductive layer and the electronic component, and the second conductive layer includes a power-source line which provides a power source for the electronic component from the motherboard via the through-hole.

23. The flex-rigid wiring board of claim 15, wherein said plated metallic layer penetrates a resin area and an insulation layer of the flexible printed wiring board to connect to the first conductive layer.

* * * * *